United States Patent [19]
Oroku et al.

[11] Patent Number: 5,213,176

[45] Date of Patent: May 25, 1993

[54] SELF-PROPELLED VEHICLE

[75] Inventors: Noriyuki Oroku; Takamichi Suzuki; Toyohide Hamada; Minoru Ikeda, all of Yokohama; Hiroshi Kikuchi, Hiratsuka; Masayasu Akaiwa; Isao Takahashi, both of Yokohama; Naoki Takehara, Fujisawa; Kazumi Adachi, Fuchu, all of Japan

[73] Assignee: Hitachi, Ltd., Tokyo, Japan

[21] Appl. No.: 624,052

[22] Filed: Dec. 7, 1990

[30] Foreign Application Priority Data

Dec. 8, 1989 [JP] Japan .................................. 1-317471
Mar. 28, 1990 [JP] Japan .................................. 2-76870
Jul. 11, 1990 [JP] Japan .................................. 2-181449

[51] Int. Cl.$^5$ ............................................. B62D 61/06
[52] U.S. Cl. ........................................ 180/168; 180/212
[58] Field of Search ............... 180/168, 210, 211, 212, 180/214

[56] References Cited

U.S. PATENT DOCUMENTS

| | | | |
|---|---|---|---|
| 4,223,753 | 9/1980 | Bradbury | 180/210 X |
| 4,237,990 | 12/1980 | La | 180/212 X |
| 4,486,694 | 12/1984 | Ohba et al. | 180/168 X |
| 4,576,246 | 3/1986 | Stieber et al. | 180/168 |
| 4,657,104 | 4/1987 | Holland | 180/212 X |
| 4,715,460 | 12/1987 | Smith | 180/210 X |

Primary Examiner—Margaret A. Focarino
Assistant Examiner—Michael Mar
Attorney, Agent, or Firm—Antonelli, Terry, Stout & Kraus

[57] ABSTRACT

A self-propelled vehicle capable of all directional movement over a floor surface and adapted to be guided along a path such as a semiconductor processing line. The vehicle is provided with at least three wheels having a construction enabling rotational movement in a rotational plane of the wheel and in a direction orthogonal thereto. When at least four wheels are provided, the vehicle is provided with a suspension mechanism for mounting the wheels and a mechanism for maintaining a parallel relationship of the suspension mechanism and a chassis of the vehicle so that slanting of the vehicle body during travel is avoided. Also, the vehicle is provided with a vibration preventing base interposed between the vehicle and a substance mounting base for controlling the proper vibration frequency of the vibration presenting base to be lower than $1/\sqrt{2}$ of the proper vibration frequency of the vehicle.

10 Claims, 29 Drawing Sheets

FIG. 6
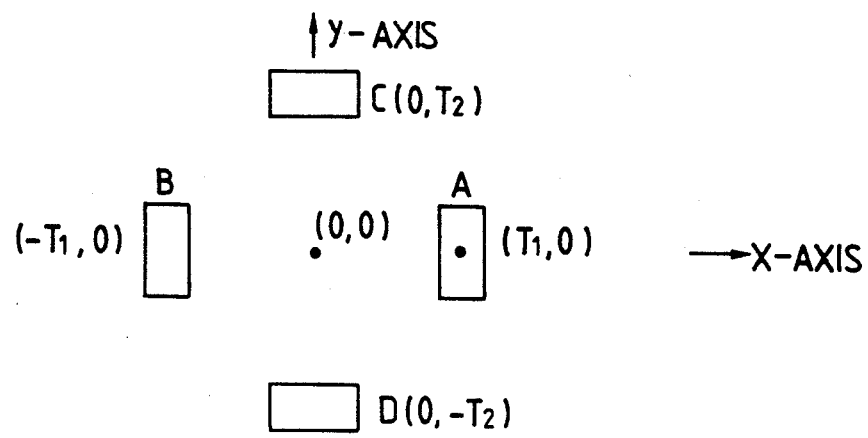
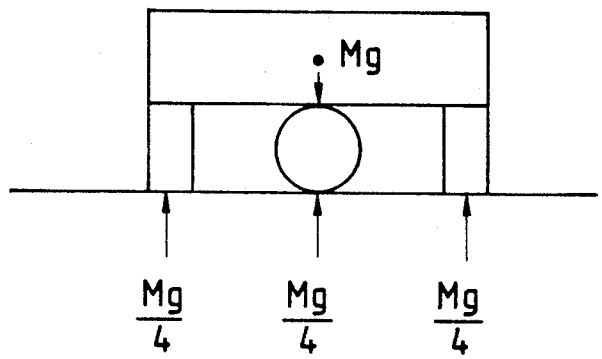
FIG. 7
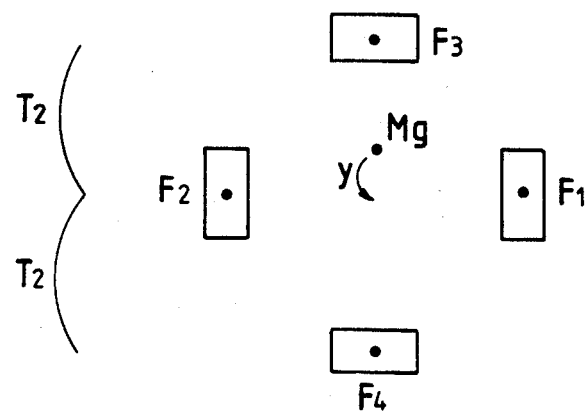

SELF-PROPELLED VEHICLE

BACKGROUND OF THE INVENTION

The present invention relates to a self-propelled, unmanned, automatically guided vehicle and, more particularly, to a vehicle which enables all-directional travel and which can be favorably used in a narrow place or a place having an uneven or undulating floor surface as is often present in a semiconductor manufacturing line and which enables carrying of a substance such as a semiconductor wafer or the like while substantially preventing vibration of the carried substance.

As a prior art traveling mechanism, there is disclosed a vehicle capable of all-directional travel as described in Japanese Patent Application Laid-Open No. 149270/1988. In this vehicle, since four wheels are arranged orthogonally and are provided with rollers having a rotational axis in the circumferential direction of the outer circumferential surface of the wheel and a reduction gear and a motor fixed to the body are utilized, movement in the traveling direction of the wheel and in the rotational direction of the roller perpendicular to the traveling direction of the wheels is possible.

In this system, however, a problem exists in that when the ground or surface contact of the four wheels with the travel surface is insecure, the straight running of the vehicle becomes difficult. That is, even if slight unevenness exists on the road surface, the state may be easily produced in that three wheels among the four wheels in the longitudinal and lateral directions are grounded stably and one wheel is not grounded, i.e., does not make proper ground contact. In this case, in order that the wheels arranged in the lateral direction are driven and the wheels in the longitudinal direction are in a stationary state and the body travels forward, if one of the lateral wheels during the driving is not grounded, the driving force of the wheels is generated in dissymmetry with respect to the body. The elimination of the partial distribution of the driving force in this case is dependent upon the anti-slip force in a direction other than the rotational direction of the rollers in the longitudinal wheels. However, since the rollers in the longitudinal wheels are rotated for the forward advance, generation of the slip in the lateral direction is inevitable due to slight deformation of the roller surface and therefore the traveling direction of the body is not stabilized. Additionally, when four or more wheels are used, the wheels must follow the unevenness of the road surface.

Further, since motion of the body on a plane has only three degrees of freedom, x, y, $\theta$ essentially, when utilizing four or more driving wheels, measures must be taken in that a driving mechanism using a differential gear mechanism is constituted, thereby a redundant degree of freedom is eliminated, or in that the circumferential speed of each wheel is strictly coincident. Otherwise, slip is inevitable. In the former measure, the mechanism is complicated and the mass of the body is increased. Consequently, this is generally unsuitable for a self-propelled vehicle powered by a battery. In the latter measure, the rotational speed of the motor is strictly controlled or the reduction ratio of the motor must be decreased so that the circumferential speed of the wheel can be easily varied by an external force. In the strict control of the circumferential speed of the wheel, the driving system of each wheel must be adjusted over the full rotational speed range and this control is quite difficult. On the other hand, when the reduction ratio of the motor is decreased, a problem exists in that the dynamic characteristics of the self-propelled vehicle as a whole are deteriorated.

The aforementioned prior art does not take into consideration the proper carrying of a substance. However, Japanese Patent Application Laid-Open No. 135485/1989, for example, discloses a device wherein a substance to be carried is set on a substance mounting bed and four corners are guided so that the substance is always held to a definite attitude, but such does not take into consideration actively preventing vibration of the substrate.

In the prior art as above described, generation of large amount of vibration cannot be avoided depending on the traveling speed of the self-propelled vehicle and the state of the traveling surface. Particularly, when a substrate carried by the self-propelled vehicle is wafer in a semiconductor manufacturing process, an outer edge portion of the wafer may be chipped by vibration during carrying or the wafer may be rubbed with a periphery to cause generation of dust and contamination of the wafer. In a semiconductor manufacturing process, the wafer, during manufacturing, is usually carried in an enclosed state in a cassette made of tetrafluoroethylene or polypropylene. Although such material is soft, and therefore is not liable to damage, the wafer and also is not liable to be abraded as an organic material, abrasion may be produced. In the semiconductor manufacturing process, since even a small amount of abrasion powder may be cause a defective state, sliding must be avoided as far as possible. However, such material has a low coefficient of friction, and the wafer is moved on the mounting base even with slight vibration acceleration. For example, in the case of tetrafluoroethylene, the static friction coefficient with metal at a low load in the atmosphere is about 0.1. Consequently, when tetrafluoroethylene is used in the mounting base of the wafer, the vibration acceleration must be suppressed to 0.1 G (about 1 m/s²) or less as follows:

$$F_1 = aM$$

$$F_2 = \mu Mg$$

Now, from $F_1 \leq = F_2$ $$aM = \mu Mg$$

$$\therefore a \leq \mu g$$

where
  $F_1$: force to cause sliding
  $F_2$: force to prevent sliding
  $a$: vibration acceleration
  M: mass of wafer
  $\mu$: static friction coefficient
  g: gravitational acceleration In the case of a self-propelled vehicle of the prior art, even if the road surface state of the traveling load is good, the vibration acceleration of about 0.3 G (about 3 m/s²) is applied to the substrate to be carried. Further, if the road surface state is bad, the vibration acceleration from 0.7 G (amount 7 m/s²) to 1 G (about 10 m/s²) or more may be applied to the substance to be carried. Thus, in the prior art, the carrying, particularly requiring avoidance of vibration, such as wafer carrying in a semiconductor manufacturing process is not sufficiently considered, and a problem exists in that impact is applied to the substance to be carried and damage is produced. Particularly, when the substance to be carried is a semiconductor wafer or the like, a problem exists in that generation of dust due to the abrasion of the mounting base or the like causes a defective state of the wafer.

SUMMARY OF THE INVENTION

It is therefore an object of the present invention to provide a self-propelled vehicle where the stability of the traveling direction in an all-directional traveling mechanism is improved and the slanting of the body of the vehicle is prevented.

Another object of the present invention is to provide a vehicle having a suspension and constraining mechanism whereby the slanting of the body can be prevented in a simple structure.

A further object of the present invention is to provide a self-propelled vehicle where slip of the wheels is not generated and avoid use of a complicated mechanism without deteriorating the dynamic characteristics of the vehicle.

Another object of the present invention is to provide a self propelled vehicle having a function of preventing a substance from being vibrated and of positioning the substance and loading the same accurately.

In order to attain the foregoing objects, the present invention provides a self-propelled vehicle having first and second transversely arranged holding members, wheels mounted at both ends of the first and second holding members, respectively, a chassis installed on the first and second holding members and the wheels, and a plurality of support mechanisms installed between the chassis and the first and second holding members, for example, a plurality of cantilever support mechanisms for constraining the chassis and the first and second holding members to be in parallel to each other, and a plurality of elastic support mechanisms installed between the chassis and the first and second holding members.

By providing the first and second transversely arranged holding members for holding the wheels, a cantilever support mechanism and a suspension mechanism such as an elastic support mechanism, an imaginary axle of the driving wheels in a pair is held in parallel to the body and moves up and down. Consequently, even if four driving wheels are provided and the undulation or the like of the road surface exists, a state does not occur that one among the driving wheels is not grounded. That is, when a depression exists on the road surface and the grounding pressure of one wheel is decreased, since the total sum with the grounding pressure of the opposed wheel is decreased, the suspension mechanism to support the wheel in a pair lengthens and the wheel body is slanted so as to follow the road surface and the grounding pressure of the wheel at the depression side of the road surface is increased. Then the grounding pressure shared by other imaginary axle is increased and the equality of the grounding pressure between the imaginary axles is broken. However, since the grounding pressure of the wheels at both ends of one imaginary axle is equal and both wheels exist at the opposed positions with respect to the center of gravity, generation of a coupling force due to the partial distribution of the driving force is prevented thereby the straight advance property is not obstructed.

Further, since the driving wheels are arranged so that the axles are on two straight lines perpendicular to each other, and the driving wheels in a set arranged on the same straight line are held by the suspension mechanism holding the parallelism to the body and moving up and down, when a partial load is applied to the body but the floor surface is not deformed, a specific wheel does not sink, and rolling or pitching is not generated in the vehicle body. Particularly, when a vehicle mounting a robot arm is provided, the vehicle body is not slanted due to the attitude variation of the robot and the position reproducibility of the robot arm is not deteriorated and therefore the construction is suitable for this purpose.

Further, the present invention also provides a self-propelled vehicle having three wheels, each wheel provided with rollers arranged on plural lines at an outer circumference of the wheel, and having axes in the circumferential direction of the wheel, which wheels are used as driving wheels. In order to reduce difference of acceleration of the vehicle due to a difference of the moving direction, the three wheels are arranged so that axles are not in relation of perpendicular or parallel to each other. Due to driving by three wheels, the self-propelled vehicle has a tendency to tip or fall over. However, when the vehicle has a rectangular frame or chassis, two wheels are installed at both ends of a major side and one remaining wheel is installed near the center of another major side, thereby the self propelled vehicle does not easily tip or fall over. Since three wheels have separate main shafts, in comparison to the case where axles are orthogonal in four wheels or six wheels, the control is therefor complicated and is different from control of a conventional vehicle to perform the steering, and a control for three wheels is provided.

With a construction wherein each wheel is provided with a plurality of rollers arranged on plural lines at a periphery of the wheel and having the rotary axes in the circumferential direction of the wheel, each wheel can be freely moved in the rotary axis direction of each wheel. In this case, if these wheels are arranged at three points being not on the same line, since the grounding surface of each wheel is determined uniquely, the grounding of all wheels can be obtained even if a suspension mechanism which is required in the case of four or more wheels is not used. Further, in the arrangement that the three wheels are directed in different directions, depending on the combination of the circumferential speeds of the wheels, any moving becomes possible in longitudinal and lateral and oblique directions and rotation. A similar function can be realized also in the case of four or more wheels, but the number of wheels becomes a minimum in the case of three wheels.

If the three wheels are installed at such angle that line formed by axle of each wheel passes through position just below the center of gravity of the vehicle or through position just above it, the rotational speed of the wheel accompanying the rotational movement is determined by a reciprocal from the center of gravity to the wheel for the rotation around the center of gravity, it is advantageous in that the control becomes easy. On the other hand, when main traveling directions of the vehicle can be limited in longitudinal and lateral directions, assuming that more of the main direction is the longitudinal direction, if one wheel is arranged having the rotational plane in the longitudinal direction and two wheels are arranged in directions of +45 degrees and −45 degrees with respect to the longitudinal direction, since the wheels in the oblique directions have the same absolute value in the circumferential speed of the wheel at straight advance state and at lateral traveling state, the calculation is reduced. Also, since no wheel is directed to the more main traveling direction, a specific roller of a wheel is scarcely grounded with concentration.

Further, in any of the above-mentioned cases, even if characteristics of a servo motor or the like fluctuate, since the wheels are three in number, slip of the wheel due to the redundant degree of freedom is not produced. On the other hand, since the position deviation with respect to the target of the vehicle is detected as a relative position from the definite position target by a sensor and the position deviation in the lateral direction and the angular deviation in the traveling direction are controlled separately, generation of overshoot accompanying the conventional steering can be reduced to a minimum, thereby the control is possible with high accuracy. In order to reduce the burden of the control system, in a similar manner to the conventional steering, the basic traveling direction is fixed, and the control of the self-propelled vehicle is possible also by an angle of the vehicle to the target traveling direction.

When the control device is constituted by a digital computer, since the coefficient of the control can be freely varied, the degree of freedom in the traveling direction or the like can be increased. When the control device is realized by an analog circuit, since the operation is possible in real time, delay of the dead time of the control due to the sampling time can be reduced, thereby the control becomes possible with high accuracy.

In accordance with the present invention, the self-propelled vehicle is provided with a mounting base for mounting a substance to be carried including a vibration preventing base which eliminates vibration among vibrations received by the vehicle from the traveling surface, regarding a high frequency region, at the center of a rubber spring or combination of passive mechanical parts such as a spring, a damper or the like, and regarding a low frequency region, at the center of active mechanical parts to supply acceleration to the vehicle body based on the detection result of a detector for detecting the vibration received by the vehicle from the traveling surface as acceleration from a virtual stationary point, so as to make the natural or proper frequency of the mounting base lower than $1/\sqrt{2}$ of the natural or proper frequency of the vehicle body, the proper frequency representing the lowest natural resonant frequency of the body; and a vibration preventing base which is provided with a position sensor for measuring the position relation between the mounting base and the vehicle body when the substance is loaded or unloaded onto the mounting base, and a positioning mechanism for positioning the position relation between the mounting base and the vehicle to a determined reference position. Further, an actuator of the positioning mechanism is made a direct acting type linear driving device by a magnetic field, and the vibration caused by error of the positioning mechanism is prevented.

Since the present invention provides that the vibration preventing base of the vehicle is a soft support structure low in natural frequency and movable, when vibration is generated in the vehicle body, the mounting base is moved so as to reduce the acceleration applied to the substance to be carried, thereby the vibration of the vehicle is prevented from being transmitted to the substrate. Since the natural frequency of the soft support structure is suppressed lower than $1/\sqrt{2}$ of the natural or proper frequency body, the vibration with a natural frequency higher than that of the self-propelled vehicle can be effectively interrupted.

In the case of the vibration preventing system using passive mechanical parts only and being low in a natural frequency, if the self-propelled vehicle is vibrated at a frequency near the natural frequency of the mounting base due to undulation of the road surface or the like, the vibration of the mounting base is rather amplified. Consequently, an acceleration sensor and an actuator are installed on the mounting base, and the actuator is controlled so that the mounting base is not moved with respect to the inertia system (virtual stationary point), thereby the present invention provides an active vibration preventing mechanism. According to the active vibration preventing mechanism, in comparison to the case of the vibration preventing system using the passive mechanical parts only and being low in natural frequency, particularly the vibration for the vibration generating force of a low frequency can be prevented.

Further, since the present invention provides a mechanism to fix the position relation between the mounting base and the self-propelled vehicle to the determined reference position by providing a positioning mechanism fixed to the vehicle, the position of the substance with respect to the vehicle is determined during the loading, thereby the transfer by the transfer mechanism such as a robot arm can be securely performed. The position sensor for measuring the position relation between the mounting base and the vehicle is further installed, and control of the positioning mechanism is gradually raised so that during the positioning of the mounting base, the position moving speed of the mounting base in the existing state is not rapidly varied, and the vibration by moving the mounting base rapidly to the reference position during the positioning operation is not generated.

As an actuator common to the active vibration preventing mechanism and the positioning mechanism, a mechanical deceleration mechanism is not utilized, but rather a direct acting type linear driving device is used, so that a junction of the stationary member of the actuator with the movable member thereof is gentle. Consequently, for the vibration preventing operation, the high frequency range can be shared with the passive vibration preventing mechanism and the low frequency range can be shared with the active vibration preventing mechanism. Also, even if the actuator has a response delay for the high frequency oscillation, the sensitivity in the high frequency range is lowered thereby self oscillation can be prevented without deteriorating the vibration preventing ability of the whole system. Further, the present invention provides that the mounting base is not contacted directly with the stationary member of the positioning mechanism, and the vibration caused by the large acceleration due to rigid contact is not generated although it becomes a problem in the case of using the mechanical positioning mechanism.

These and further objects, features and advantages of the present invention will become more obvious from the following description when taken in connection with the accompanying drawings, which show for purposes of illustration only, several embodiments in accordance with the present invention.

BRIEF DESCRIPTION OF THE DRAWINGS

FIGS. 6 to 8 are schematic diagrams for analyzing the suspension mechanism of the present invention;

DETAILED DESCRIPTION OF THE PREFERRED EMBODIMENTS

Figure 1:
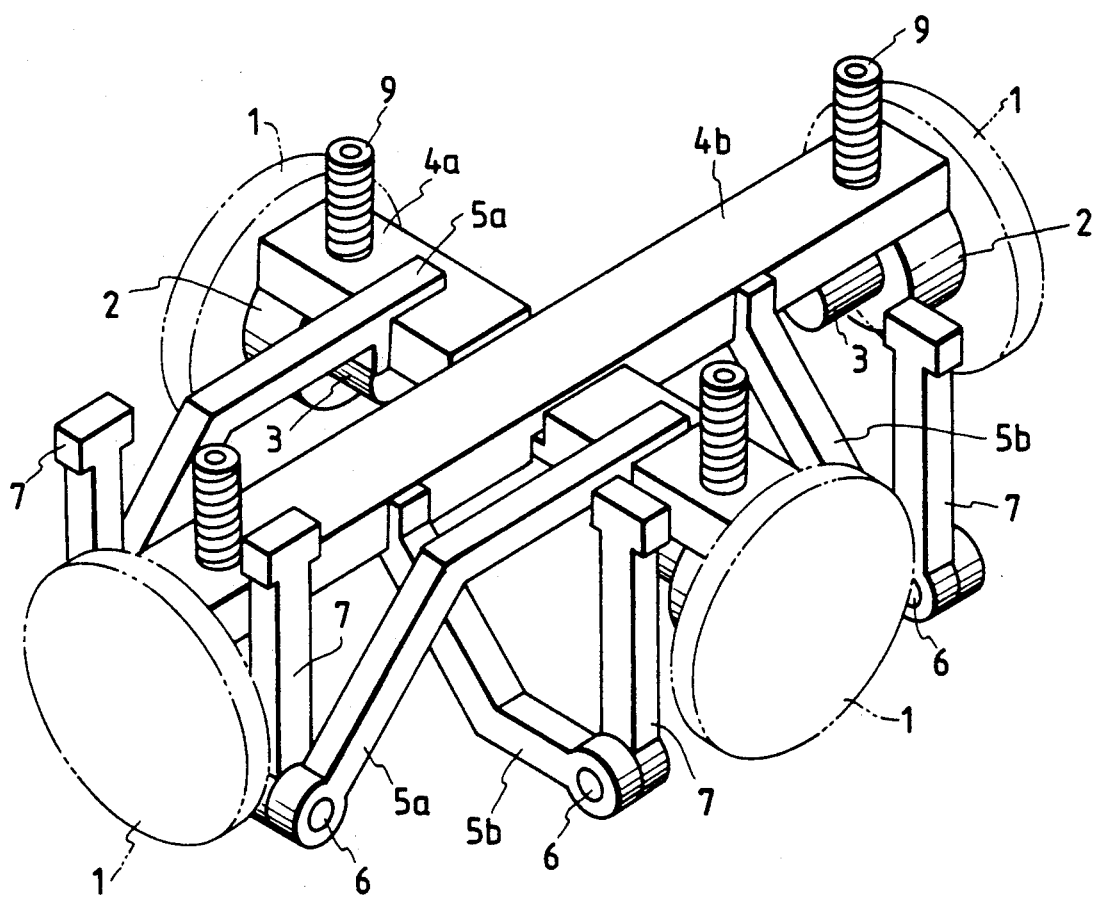
FIG. 1 is a perspective view of a suspension mechanism of an embodiment of the self-propelled vehicle of the present invention showing a simplified structure as viewed from an oblique upper direction.
Figure 2:
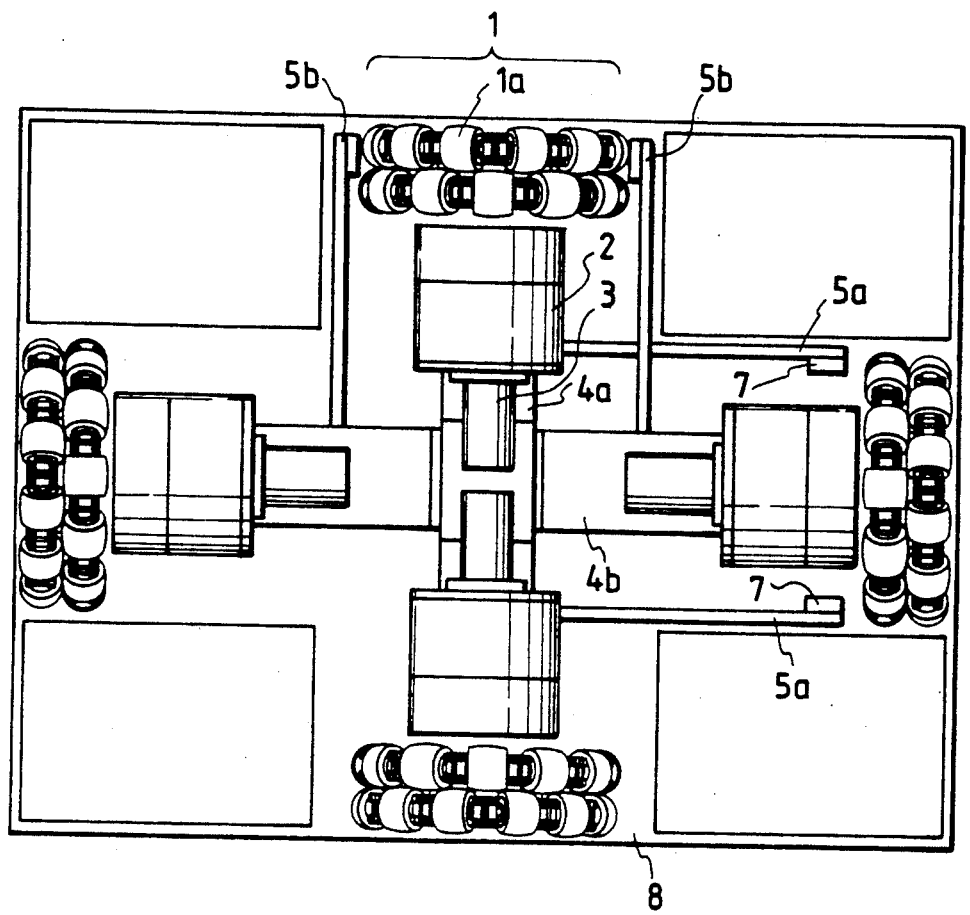
FIG. 2 is a bottom view of structure of the suspension mechanism in FIG. 1.
Figure 3:
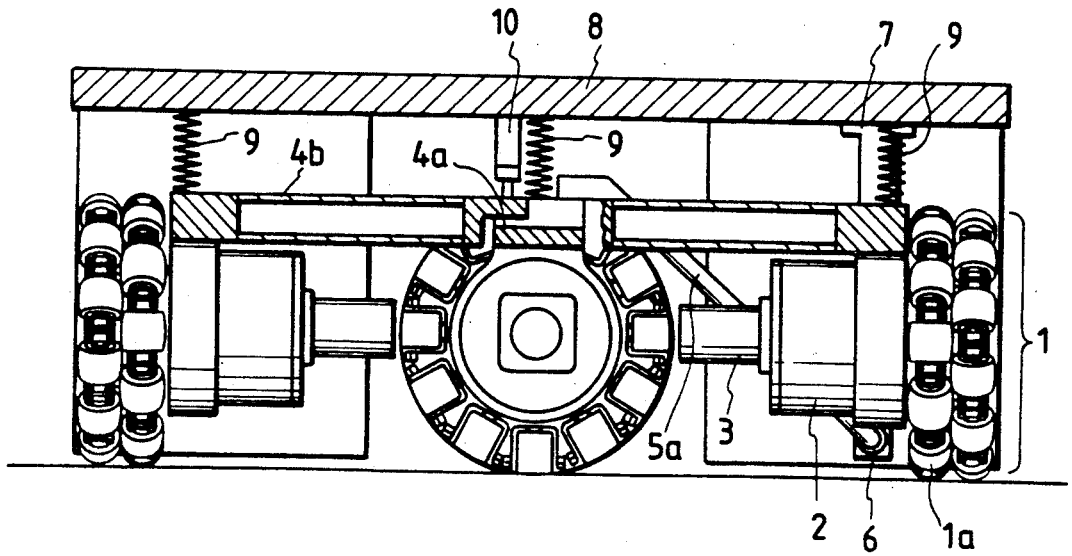
FIG. 3 is a longitudinal sectional view of FIG. 2.
Figure 4A:
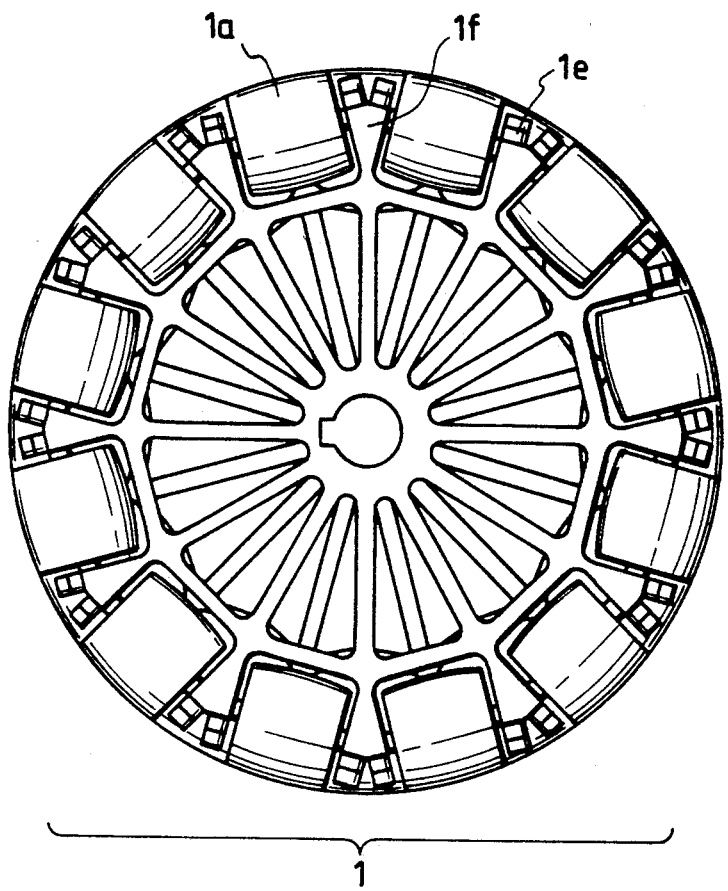
FIGS. 4(a), 4(b) and 5 are views showing the structure of a wheel of a vehicle of the present invention.
Figure 4B:
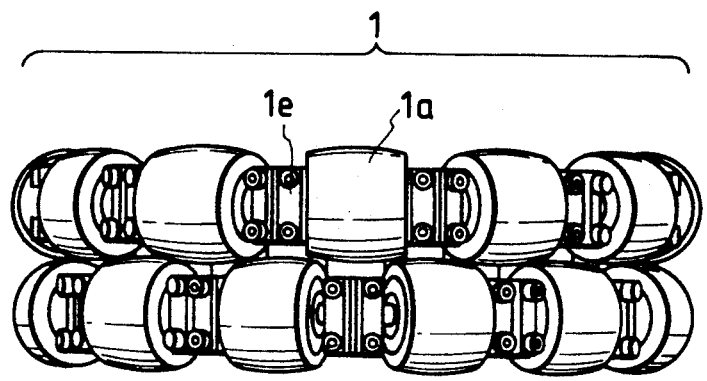
Figure 5:
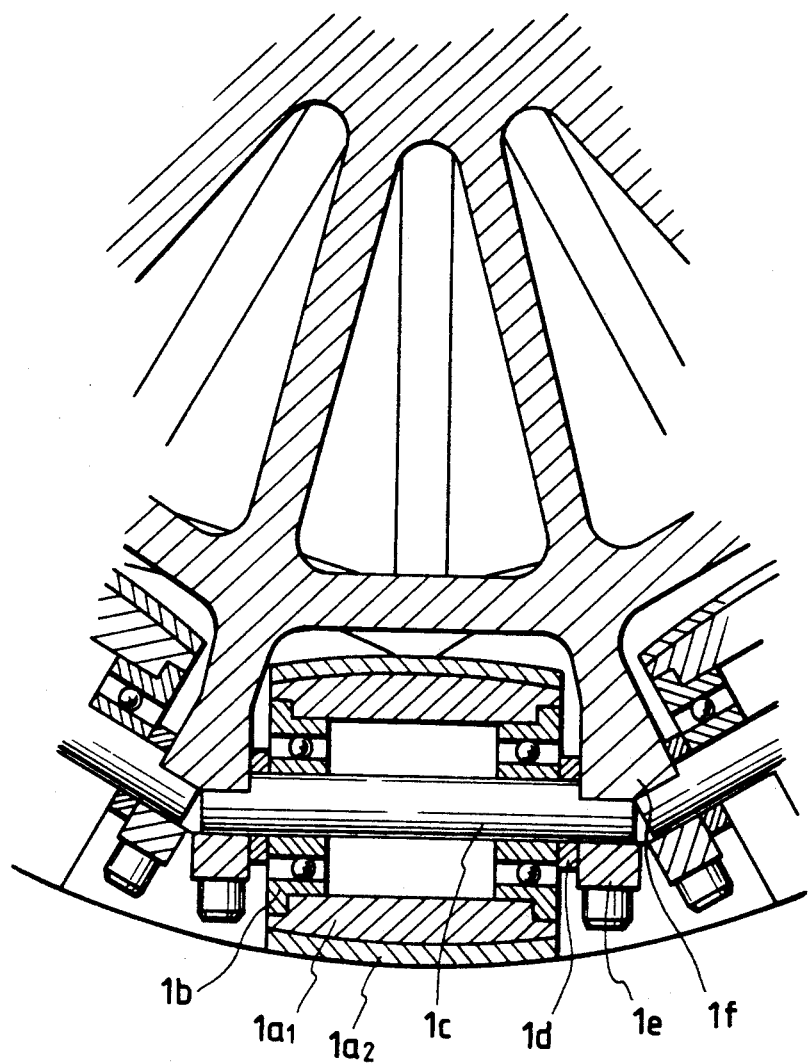

Referring now to the drawings, FIG. 1 is a perspective view of an embodiment of the present invention showing a suspension mechanism of the vehicle from an oblique upper direction, FIG. 2 is a plan view of the vehicle looking up from the bottom surface, and FIG. 3 is a longitudinal sectional view of the vehicle divided by a center line in the longitudinal direction. In FIG. 1, the wheels 1 are schematically shown, and a main chassis 8 is not shown. The wheel 1 as shown in FIGS. 4 and 5 has a structure that shafts extending in the tangential directions are provided respectively on the outer circumferential surface, and rollers are rotatable around respective shafts. A roller 1a comprises a roller core 1a1 and a roller rubber layer 1a2, and the roller 1a is rotatable about a shaft 1c by a bearing 1b. The shaft 1c is fixed to a wheel 1f by a spacer 1d and a pressure plate 1e. At a gap between rollers 1a by the spacer 1d and the pressure plate 1c, since other rollers 1a are arranged alternately in zig-zag shape, or positions shifted to the rotary axis direction of the wheel 1, the outer form projected in the rotary axis direction of the wheel 1 is a circular form. Due to the structure of the wheel 1, the wheel transmits the driving force or the brake force in the tangential direction viewed from the rotary axis direction to the floor surface, but does not transmit force to the direction perpendicular to the driving force or the brake force.

Each of the wheels 1 as shown in FIGS. 1 to 3, is driven independently through a reduction gear 2 by a motor 3. Even if a motor 3 is not provided, a similar effect can be attained by driving the vehicle from the outside. The wheel 1, the reduction gear 2 and the motor 3 rotatable in two directions are fixed to holding members 4a, 4b (hereinafter referred to as a "sub-chassis") which are in parallel to a main chassis or bed 8 (see FIG. 3) and perpendicular to each other, so that on the same sub-chassis 4, the rotary axis of the wheels 1 exists on the same line. The rotary axis possessed commonly by the wheels 1 is called an imaginary axle, and since the sub-chassis 4a, 4b are perpendicular to each other, the imaginary axles are also perpendicular crosswise. These sub-chassis 4a, 4b are fixed to swing arms 5a, 5b arranged extending in the same direction from the symmetric position with respect to the center portion of each sub-chassis and also to bearings 6 so that they hang down lower than the main chassis 8. The sub-chassis 4a, 4b are connected to the main chassis 8 through rods 7 arranged with other ends of the corresponding swing arms 5a, 5b through the bearings 6 respectively. Further, a spring 9 and damper 10 (see FIG. 3) are arranged between each of the sub-chassis 4a, 4b and the main chassis 8.

Due to the structure and arrangement of the wheels 1, when travel in an arbitrary direction is intended, if the rotational speed of the wheel 1 is made a projective component of the speed vector in the aimed traveling direction, travel in an arbitrary direction is possible even if the direction of the body is not changed. Further, if all wheels 1 are rotated to the same direction so that the rotational speed is proportional to the distance from the rotational center to the wheel 1, the body spins at the position in the reverse direction to the rotation of the wheel 1.

Since the sub-chassis 4a, 4b are connected respectively through the swing arms 5a, 5b, the bearings 6 and the rods 7 to the main chassis 8, even if undulation or unevenness exists on the floor surface, excessive vibration, is not transmitted to the main chassis 8, and the four wheels 1 follow the floor surface and hold sufficient grounding pressure. The spring 9 and the damper 10 used in this case, of course, must be those in suitable range. For example, if the spring 9 or the damper 10 is excessively strong, the vehicle may jump up for the undulation of the floor surface. If the spring 9 is excessively weak, sufficient force to ground the wheel 1 may not be obtained for the depression of the floor surface and the wheel 1 facing the depression of the floor surface cannot obtain sufficient grounding pressure. When the running road surface is flat, without the spring 9 and the damper 10, parallelism between the main chassis 8 and the load surface can be held even with a partial load.

Also, since the roller 1a is provided with the surface rubber layer 1a2, sufficiently large frictional resistance is produced between the floor surface and the roller 1a and therefore wheel spin does not occur. Further, since the two sub-chassis 4 hold the parallelism with the main chassis 8 by each swing arm 5, the parallelism between the main chassis 8 and the floor surface can be held even if a partial load is produced in the main chassis 8. Consequently, rolling or pitching is not produced in the main chassis 8 due to the partial load. The main chassis in this case includes the body itself, and when a mounting base is installed on the main chassis, the main chassis includes also the mounting base.

The reason why the main chassis 8 does not become slanted even when having a partial load will now be described in detail. As shown in FIG. 6, wherein the center of gravity exists at the center of the four wheels 1 on the flat floor surface, the vehicle is adjusted so that the load sharing of each wheel 1 becomes equal. Then if the mass of the body is M and the acceleration of gravity is g, the reaction force of the four wheels 1 received from the floor is Mg/4. In this case, the position of the center of gravity is made the origin, and coordinates of the wheel 1 are made point A to point D, $(T_1, 0)$, $(-T_1, 0)$, $(0, T_2)$, $(0, -T_2)$. In the mechanism, the wheel 1 becomes a pair of point A and point B and a pair of point C and point D on transverse lines, and is supported in parallel to the main chassis 8 by the spring 9.

Even when the position of the center of gravity is moved to the coordinates $(0,y)$ as shown in FIG. 7, it is assumed that all four wheels are in contact with the floor surface. From the assumption in the mechanism, in drags F1 to F4 subjected to the four wheels 1, the following formulas or relations (1) and (2) are satisfied:

$$F_1 + F_2 = F_3 + F_4 \quad (1)$$

$$F_1 + F_2 + F_3 + F_4 = Mg \quad (2)$$

$$F_1 = F_2 \quad (3)$$

$$F_1 = F_2 = Mg/4 \quad (4)$$

$$F_3 + F_4 = Mg/2 \quad (5)$$

$$F_3 > 0, F_4 > 0 \quad (6)$$

$$0 \leq F_3 \leq Mg/2, \ 0 \leq F_4 \leq Mg/2 \quad (7)$$

$$yMg - T_2 F_3 + T_2 F_4 = 0 \quad (8)$$

$$F_3 \geq F_4 \quad (9)$$

$$\alpha \equiv F_4/F_3 (0 \leq \alpha \leq 1) \quad (10)$$

$$F_3 = \frac{Mg}{2(1+\alpha)}, \ F_4 = \frac{\alpha Mg}{2(1+\alpha)} \quad (11)$$

$$y = \frac{(1-\alpha)}{2(1+\alpha)} T_2 \quad (12)$$

$$0 \leq y \leq -T_2 \quad (13)$$

Because, from the assumption of grounding of the four wheels, expansion or contraction does not exist in the springs to support the body. Further from the symmetry property to the Y-axis, formula (3) is also satisfied. Consequently, formulas (4) and (5) are satisfied. In this case, from the assumption of the grounding of the four wheels, formula (6) is satisfied, and from formula (5), formula (7) is satisfied.

Also from the balance of the movement around X-axis, formula (8) is satisfied. Since each term of formula (8) is positive or 0, formula (9) is satisfied. If value $\alpha$ is defined in formula (10), F3 and F4 can be expressed as in formula (11). If this is substituted in formula (8), formula (12) can be obtained. Consequently, y has a range given by formula (13). In this case, when $y = T_2/2$, it follows that $F_3 = Mg/2$ and $F_4 = 0$. From the above description, when the center of gravity is positioned within a half of the distance from the center of the four wheels 1 to any wheel 1, the body or chassis of the above-mentioned mechanism is not slanted.

Figure 8:
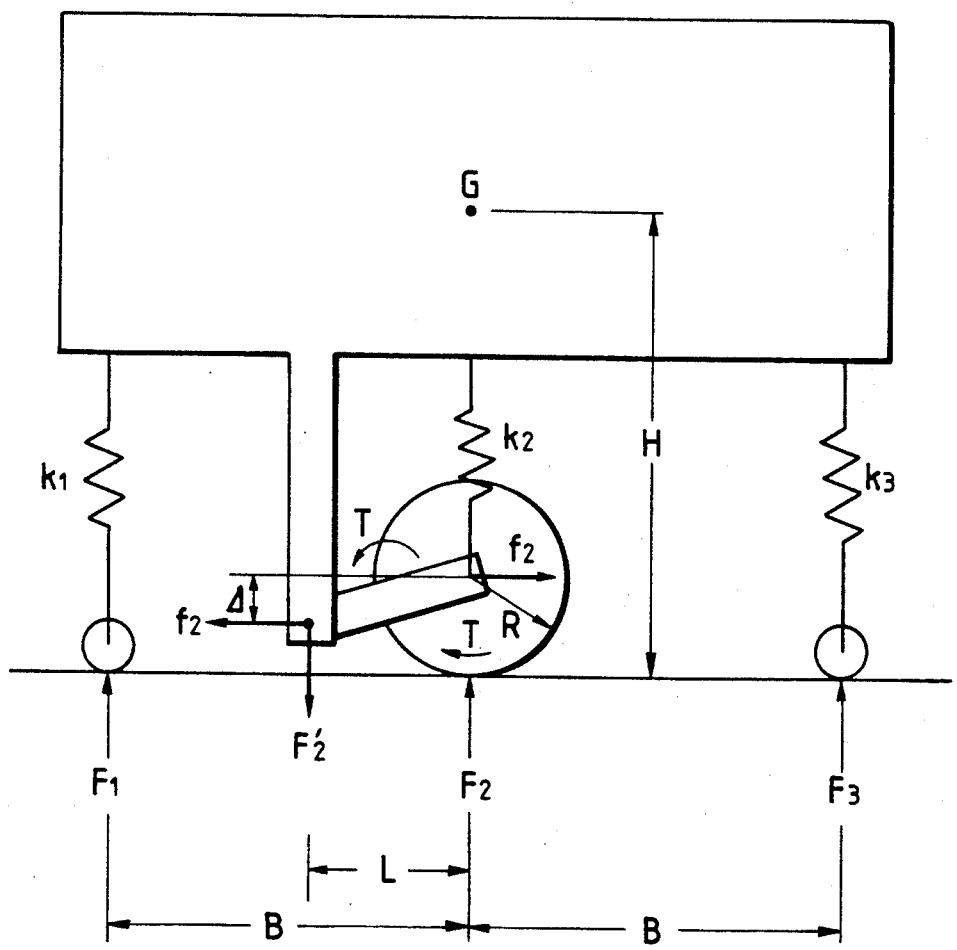

In FIGS. 1 to 3, the bearing 6 between the swing arm 5a and the rod 7 is disposed lower than that of the rotary axis of the wheel for the following reasons. Referring FIG. 8 which is a diagram schematically showing a suspension mechanism of an embodiment of the present invention, the balance of the force around the swing arm 5 will be analyzed. For simplification, lateral driving wheels are deemed as one body, and the rolling friction of the wheel, the mechanical loss of driving and the movement of inertia of the wheel is omitted. When driving torque T is applied to the driving wheel, the driving wheel supplies the torque $-T$ and the tractive force $f_2$ as the reaction force to the swing arm 5a. The torque $-T$ to depress the bearing 6 acts on the swing arm 5a, and the height of the bearing 6 sinks $\delta_2$. On the other hand, when the height of the bearing 6 at the static state is lower by $\Delta$ than that of the rotary axis of the wheel 1, the reverse torque $(\Delta + \delta_2) \times f_2$ caused by the tractive force $f_2$ and the difference $\Delta + \delta_2$ between the height of the bearing 6 and the height of the rotary axis of the wheel 1 is also produced. When the length L in the horizontal direction of the swing arm 5 is $L >> \delta_2$, if the tension of the rod 7 is made $F_2'$ and the vertical drag from the floor surface to the driving wheel at the static state is made $F_2$, the relation of the following formula (14) is satisfied when the radius of the wheel 1 is R.

$$T - (\Delta + \delta_2) f_2 - L F_2' = 0 \quad (14)$$

$$F_2' = \{T - (\Delta + \delta_2) f_2\}/L \quad (15)$$

$$T = R f_2 \quad (16)$$

$$F_2' = (R - \Delta - \delta_2)f_2/L \quad (17)$$

$$\delta_1 = \delta_2 = \delta_3 = \delta_4 = \delta \quad (18)$$

$$2k_1 = k_2 = 2k_3 \quad (19)$$

$$\delta = F_2'/(2k_2) = (R - \Delta - \delta)f_2/(2kL) \quad (20)$$

$$\delta = \frac{(R - \Delta)f_2}{2k_2L + f_2/L} \quad (21)$$

Consequently, formula (15) is obtained. In this case, from the relation of formula (16), formula (17) is obtained. In this case, from the assumption that slanting cannot be generated in the embodiment, formula (18) is satisfied, and since the spring 9 of each wheel 1 is equal, formula (19) is satisfied. Further, since the sinkage is due to the tension of the rod 7, formula (20) is satisfied and therefore above formula (21) is obtained. In order that the sinkage δ accompanying with acceleration/deceleration is made 0 from above formula (21), the relation of R=Δ is sufficient.

However, since this result means that the center of the bearing must be made the same height as that of the floor surface, this cannot be realized as it is. Further since the length of the swing arm 5 is limited, is Δ is taken to be large, it follows that the swing arm 5 is greatly slanted. When undulation or unevenness exists on the floor surface and when the load of the vehicle fluctuates, depending on the vertical motion of the subchassis 4 to the main chassis 8, the main chassis 8 may be swung in the longitudinal direction and the lateral direction. From this point of view, Δ is preferably made 0.

Under consideration of the state of the floor surface and the load fluctuation of the vehicle to be predicted and the acceleration required for the vehicle, Δ must be set to a suitable value between 0 and R.

Figure 9:
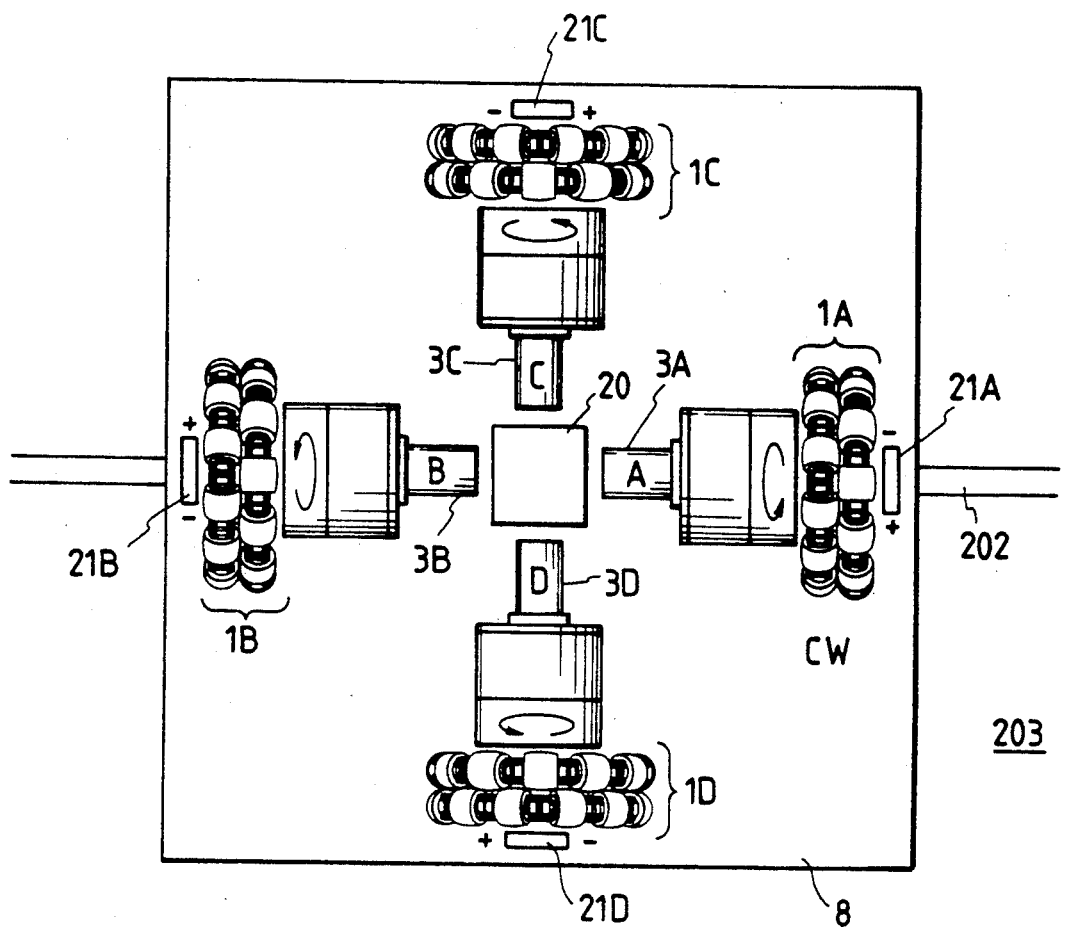
FIG. 9 is a plan view of a self-propelled vehicle with a control device and a sensor of the present invention.
Figure 10:
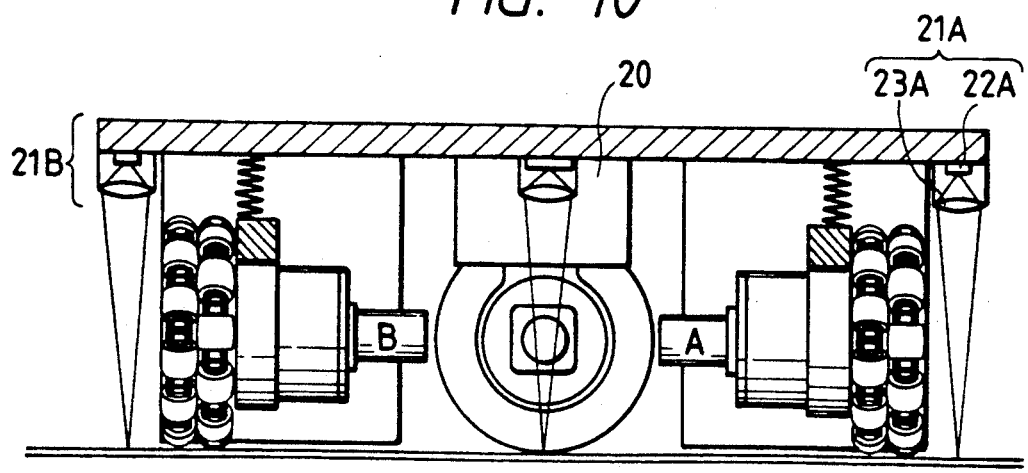
FIG. 10 is a front view of the vehicle of FIG. 9.
Figure 11:
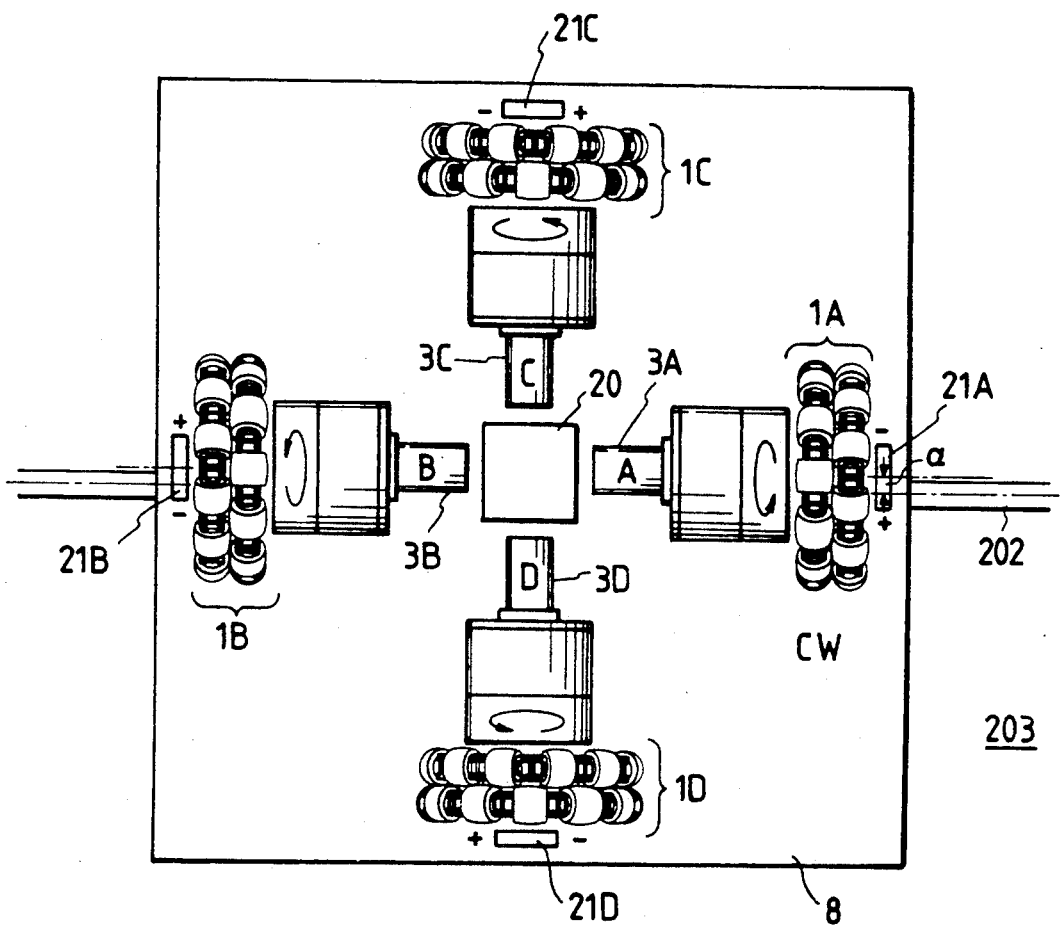
FIGS. 11 to 13 are plan views of the vehicle of FIG. 9 showing different positional arrangements of the vehicle with respect to a guide.
Figure 12:
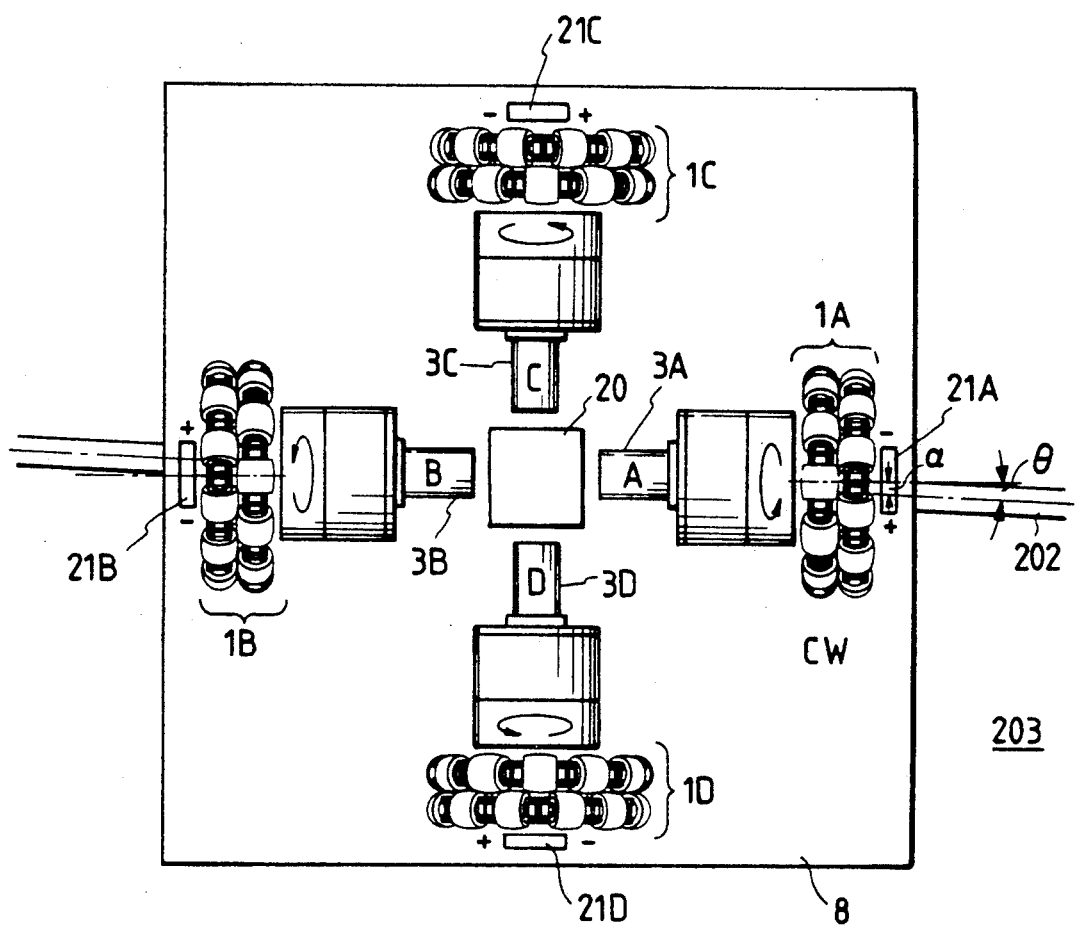
Figure 13:
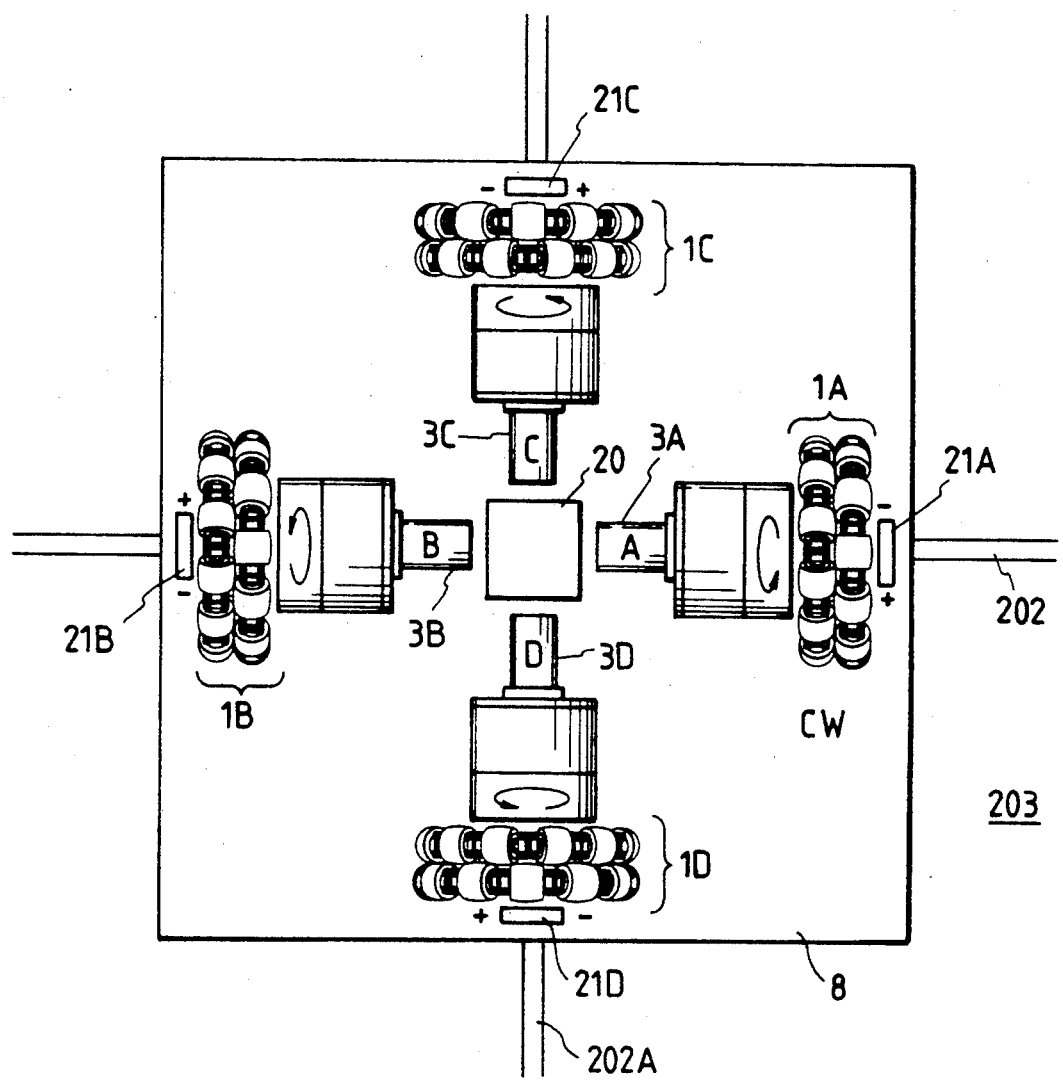
Figure 14:
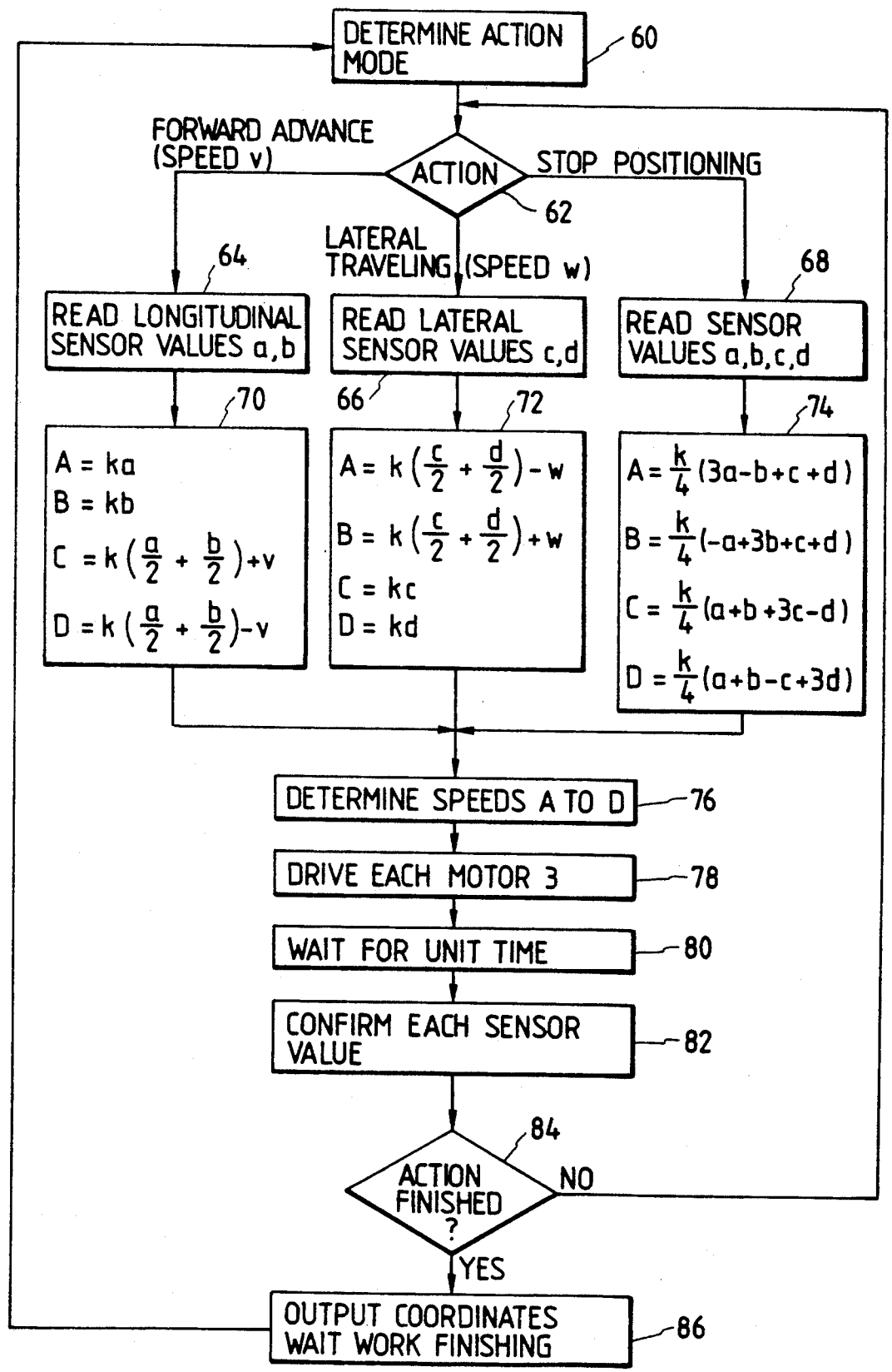
FIG. 14 is a flow chart showing a control method for the vehicle of FIG. 9.

The control of the vehicle will now be described referring to FIGS. 9 to 14. FIG. 9 is a plan view of a vehicle with a control device and a trace sensor from the upper side of the vehicle looking downwardly. FIG. 10 is a front view of the vehicle of FIG. 9. FIGS. 11 to 13 are plan views of the vehicle of FIG. 9 showing arrangements shifted from the guide target. FIG. 14 is a flow chart showing the principle of the control device of the vehicle in FIG. 9. Although the following description is simplified assuming that the wheels 1A to 1D are arranged at equal distances from the center of the main chassis 8, suitable correction is performed when the wheels are not arranged actually at equal distance.

Sensors 21A to 21D comprising a one-dimensional CCD element 22 and an optical system 23 are installed near the wheels 1A to 1D to detect a guide target 202 comprising a tape with surface state having a high reflection coefficient installed on a floor surface 203, and the sensors output the deviation between the center axis of the guide target 202 or the boundary between the guide target 202 and the floor surface 203 and the center axis of the sensors 21A to 21D. The output from the sensors 21A to 21D is inputted to a controller 20, which controls motors 3A to 3D.

A resetting or repositioning operation of the main chassis 8 will be described in the case that the main chassis 8 is shifted from the guide target 202 while the main chassis 8 is traveling along the guide target 202 in the X direction at a target speed v.

As shown in FIG. 11, when the main chassis 8 is arranged in parallel to the direction indicated by the guide target 202, but its center is shifted by a distance α, the output of the sensor 21A becomes α and the output of the sensor 21B becomes −α. On the other hand, when the center of the in chassis 8 is arranged, along the position shown by the guide target 202 but its direction is shifted by angle an θ and the position of the sensors 21A and 21B is shifted by the distance α as shown in FIG. 12, both outputs of the sensors 21A and 21B become α. In this case, if outputs of the sensors 21A to 21D are made A, B, C, D respectively, (A−B)/2 indicates the deviation of the main chassis 8 from the guide target 202, and (A+B)/2 indicates the angular deviation of the main chassis 8 from the guide target 202.

Then, rotational speeds of the wheels 1A to 1D and the motors 3A to 3D are made positive in the counterclockwise direction as viewed from outside of the main chassis 8, and made A, B, C, D respectively using the circumferential speeds of the wheels 1A to 1D. In the case of arrangement of FIG. 11, if A=α, B=−α, C=−v, and D=v, the main chassis 8 is reset or repositioned on the guide target 202 after unit time. On the other hand, in the case of arrangement of FIG. 12, if A=α, B=α, C=v+α and D=v+α, the main chassis 8 is repositioned to the direction of the guide target 202. If the outputs of the sensors 21A and 21B are made a, b respectively, and (a+b)/2=m, (a−b)/2=n, the circumferential speeds of the wheels 1A to 1D are expressed by following determinant (1).

$$
\begin{bmatrix} A \\ B \\ C \\ D \end{bmatrix} = \begin{bmatrix} 1 & 1 & 0 \\ 1 & -1 & 0 \\ 1 & 0 & 1 \\ 1 & 0 & -1 \end{bmatrix} \begin{bmatrix} m \\ n \\ v \end{bmatrix}
$$

$$
= \begin{bmatrix} 1 & 1 & 0 \\ 1 & -1 & 0 \\ 1 & 0 & 1 \\ 1 & 0 & -1 \end{bmatrix} \begin{bmatrix} \tfrac{1}{2} & \tfrac{1}{2} & 0 \\ \tfrac{1}{2} & -\tfrac{1}{2} & 0 \\ 0 & 0 & 1 \end{bmatrix} \begin{bmatrix} a \\ b \\ v \end{bmatrix}
$$

$$
= \begin{bmatrix} 1 & 0 & 0 \\ 0 & 1 & 0 \\ \tfrac{1}{2} & \tfrac{1}{2} & 1 \\ \tfrac{1}{2} & \tfrac{1}{2} & -1 \end{bmatrix} \begin{bmatrix} a \\ b \\ v \end{bmatrix}
$$

determinant (1)

Also, in the repositioning operation of the main chassis in the case that the main chassis 8 is shifted from the guide target 202 while the main chassis 8 is traveling along the guide target 202 in the Y direction at the target speed w, if the outputs of the sensors 21C and 21D are made c, d respectively, and (c+d)/2=p, (c−d)/2=q, the circumferential speeds of the wheels 1A to 1D are expressed by the following determinant (2).

$$
\begin{bmatrix} A \\ B \\ C \\ D \end{bmatrix} = \begin{bmatrix} 1 & 0 & -1 \\ 1 & 0 & 1 \\ 1 & 1 & 0 \\ 1 & -1 & 0 \end{bmatrix} \begin{bmatrix} p \\ q \\ w \end{bmatrix}
$$

determinant (2)

$$= \begin{bmatrix} 1 & 0 & -1 \\ 1 & 0 & 1 \\ 1 & 1 & 0 \\ 1 & -1 & 0 \end{bmatrix} \begin{bmatrix} \frac{1}{2} & \frac{1}{2} & 0 \\ \frac{1}{2} & -\frac{1}{2} & 0 \\ 0 & 0 & 1 \end{bmatrix} \begin{bmatrix} c \\ d \\ w \end{bmatrix}$$

$$= \begin{bmatrix} \frac{1}{2} & \frac{1}{2} & -1 \\ \frac{1}{2} & \frac{1}{2} & 1 \\ 1 & 0 & 0 \\ 0 & 1 & 0 \end{bmatrix} \begin{bmatrix} c \\ d \\ w \end{bmatrix}$$

Further, when the main chassis 8 is stopped at a definite stop point wherein the guide target 202A is perpendicular thereto as shown in FIG. 13, the parallel motion is similar to the case of determinant (1) and determinant (2) and the control is superposed, but regarding rotation, since values are read simultaneously from the sensors 21A to 21D, the sensitivity is made $\frac{1}{2}$ of the case of determinant (1) and determinant (2) thereby similar control can be realized. In this case, the circumferential speeds of the wheels 171/2 to 1D are expressed by following determinant (3).

$$\begin{bmatrix} A \\ B \\ C \\ D \end{bmatrix} = \begin{bmatrix} \frac{1}{2} & 1 & \frac{1}{2} & 0 \\ \frac{1}{2} & -1 & \frac{1}{2} & 0 \\ \frac{1}{2} & 0 & \frac{1}{2} & 1 \\ \frac{1}{2} & 0 & \frac{1}{2} & -1 \end{bmatrix} \begin{bmatrix} m \\ n \\ p \\ q \end{bmatrix} \quad \text{determinant (3)}$$

$$= \begin{bmatrix} \frac{1}{2} & 1 & \frac{1}{2} & 0 \\ \frac{1}{2} & -1 & \frac{1}{2} & 0 \\ \frac{1}{2} & 0 & \frac{1}{2} & 1 \\ \frac{1}{2} & 0 & \frac{1}{2} & -1 \end{bmatrix} \begin{bmatrix} \frac{1}{2} & \frac{1}{2} & 0 & 0 \\ \frac{1}{2} & \frac{1}{2} & 0 & 0 \\ 0 & 0 & \frac{1}{2} & \frac{1}{2} \\ 0 & 0 & \frac{1}{2} & -\frac{1}{2} \end{bmatrix} \begin{bmatrix} a \\ b \\ c \\ d \end{bmatrix}$$

$$= \frac{1}{4} \begin{bmatrix} 3 & -1 & 1 & 1 \\ -1 & 3 & 1 & 1 \\ 1 & 1 & 3 & -1 \\ 1 & 1 & -1 & 3 \end{bmatrix} \begin{bmatrix} a \\ b \\ c \\ d \end{bmatrix}$$

FIG. 14 shows a flow chart of the control device realizing the above-mentioned control. First, by referring to a command supplied from a host controller 204 or a keyboard 37 or predetermined action schedule and map information incorporated in a controller 20, the action mode is determined (step 60). Next, according to the determined action, necessary values of a sensor 21 are read (steps 64, 66, 68), and among the determinants shown in determinant (1) to determinant (3), the necessary one is operated. Subsequently, the operation result is confirmed, and if an abnormal value is indicated, correction or abnormal state processing is performed and the speed of each motor 3 is determined (steps 70, 72, 74, 76). Next, each motor 3 is driven, and the unit time is elapsed (steps 78, 80). And then, each sensor value is confirmed (step 82), and a decision is effected as to whether the present action is finished or completed or not (step 84). In the case that the present action is not yet completed, similar action is repeated, and in the case that it is finished, if any work is performed from the outside, coordinates of the present position are outputted to the outside if necessary, and waiting is performed until the work is completed (step 86). After finishing the work, the process is again returned to the initial action. According to the above description, the travel of the vehicle is controlled.

In this case, although the gain of the control system is made 100% for explaining the principle, the gain must be corrected to a suitable value in the actual control system. Also, an integral term, differential term or the like in the control is ignored in the above description, but in the actual control, of course, such term is considered, whereby the performance is improved.

Figure 15:
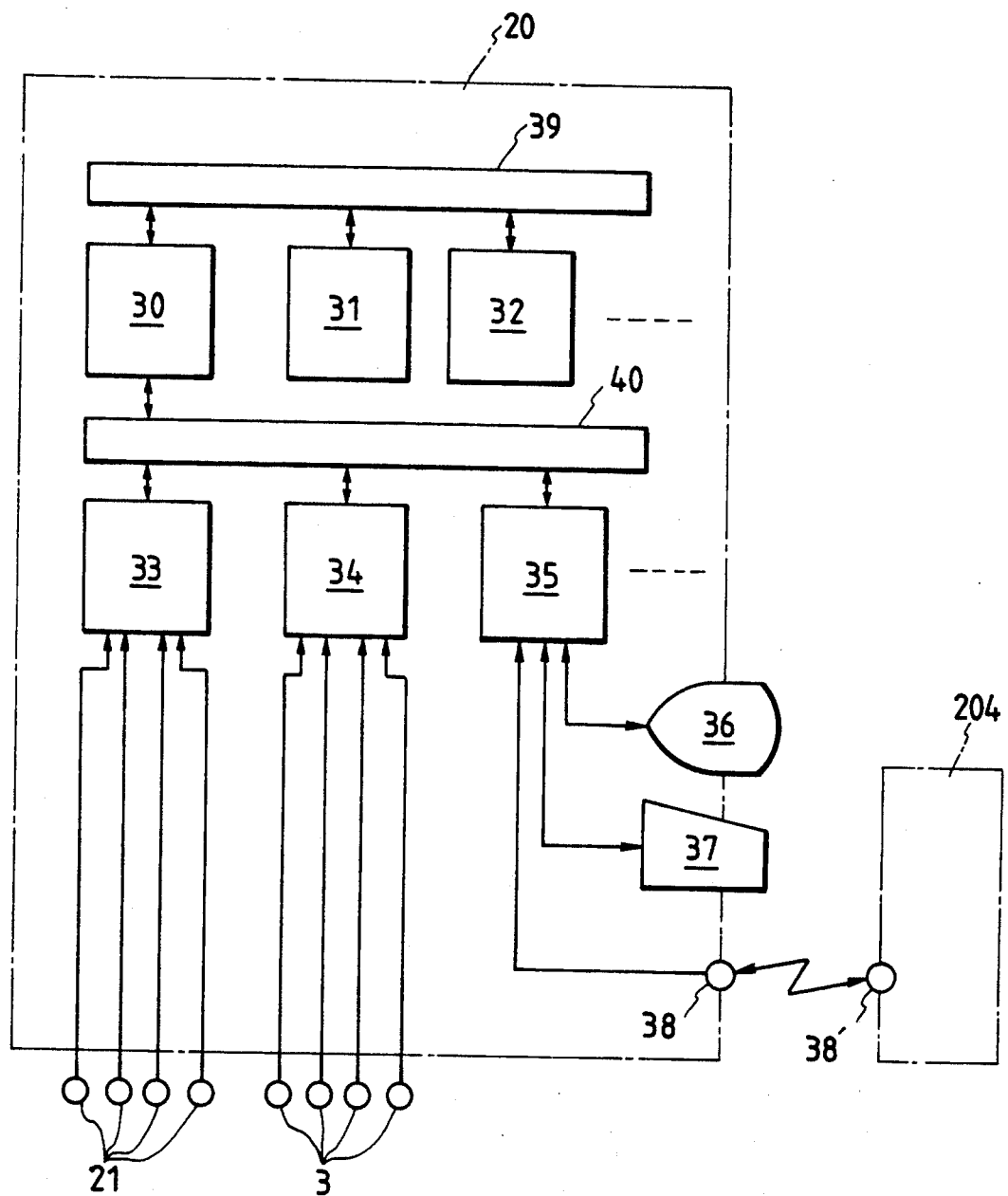
FIG. 15 is a block diagram showing structure of a control device for the present invention.

FIG. 15 is a block diagram showing a structure of the controller 20 performing the above-mentioned processing. A central processing unit 30 is connected through a main communication device such as a bus 39 to a reloadable memory 31 and a read only memory 32. According to the program and the map information or the like stored in these memories 31, 32, the processing as shown in FIG. 14 is performed. Further, in order to perform sending/receiving of the operation result and to read the data of the external sensor 21, the central processing unit 30 is connected through a subcommunication device or signal bus 40 to a signal input/output device 33, a motor control device 34 and an external communication device 35. The signal input/output device 33 manages signal input/output means such as a sensor 21, and the motor control device 34 controls the motors 3. Further, the external communication device 35 is connected to a display device 36, a keyboard 37 and a communication terminal 38 performing communication of informing the abnormal state generation, the operation finish and the operation result in a non-contact state with at least the controller 204.

Figure 16:
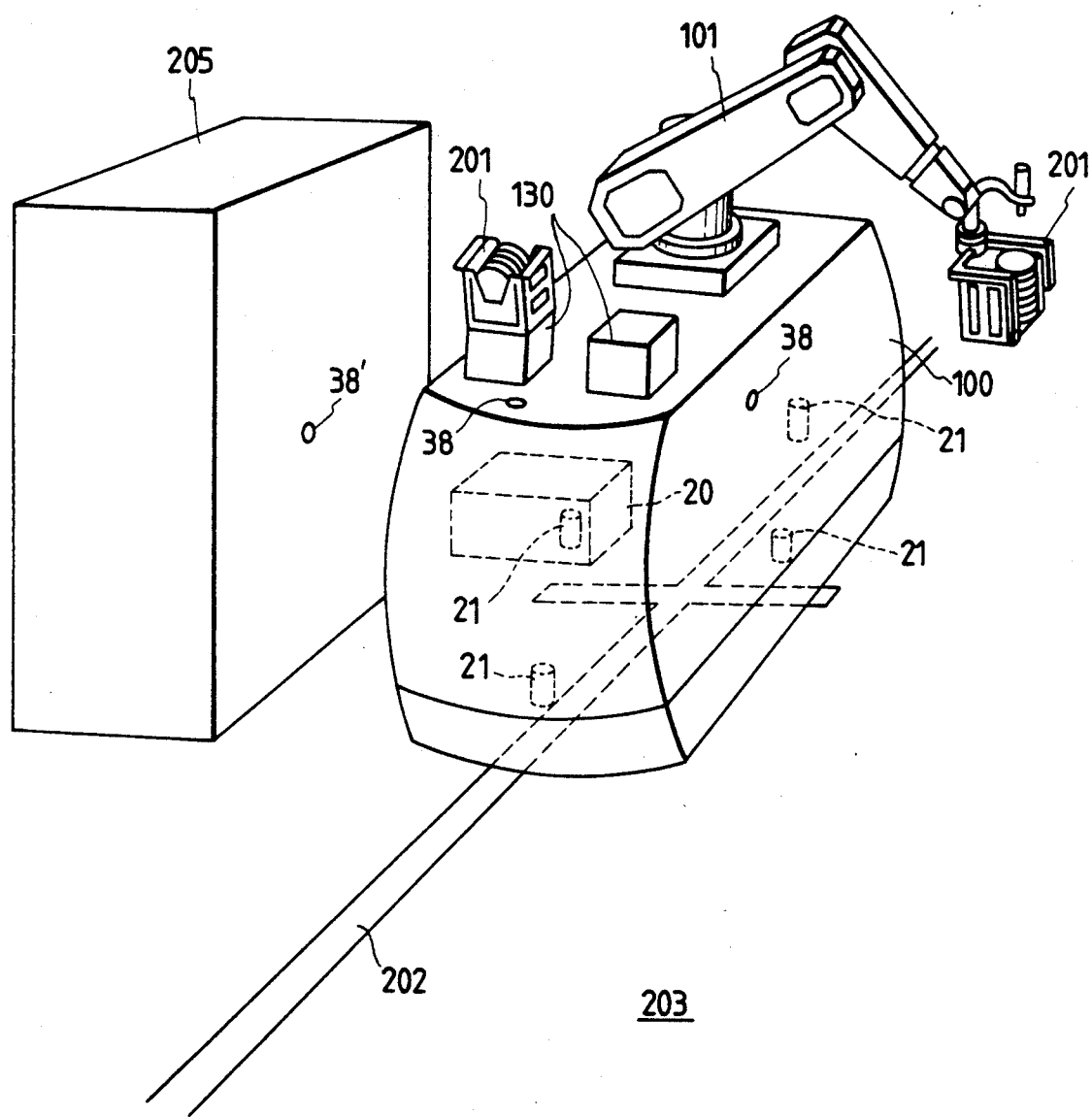
FIG. 16 is a perspective view of an embodiment of the present invention where a loading device is added to the vehicle.

FIG. 16 shows an example where the embodiment is applied to an unmanned carrying vehicle with an arm. The unmanned carrying vehicle 100 measures the position deviation of the guide target by a plurality of optical sensors 21. When work is performed using an arm 101, a controller 20 incorporated in the unmanned carrying vehicle 100 automatically corrects both position and angle of the unmanned carrying vehicle based on the output of the optical sensor 21, and operates a traveling mechanism so that the unmanned carrying vehicle comes nearly to determined position and angle in front of a work station 205. Further regarding fine error of position and angle remaining therein, the controller 20 deals with predetermined coordinates of an operation command supplied to the arm 101 for coordinate correction. Thereby the position reproducibility of the arm 101 is improved, and such a fault can be prevented that a part of the arm 101 hits a work 201 with a large force during handling of the work 201. In this case, among a communication terminal 38' of a host controller 204 installed on the working station 205 and several communication terminals 38 of the vehicle, communication is performed between the host controller 204 and the controller 20 through the communication terminal 38 corresponding to the communication terminal 38' of the host controller 204, whereby a work command or the like is sent or received. According to the suspension mechanism of the embodiment, since rolling or pitching due to a partial load does not exist essentially a feature that the unmanned carrying vehicle 100 is not caused to slant due to an upside-down moment generated by the attitude of the arm, of course, is significant for securing the position reproducibility of the arm 101. The work 201 is placed onto a base 130 on the vehicle 100. Particularly, the embodiment is most suitable for the carrying of work in a clean room for semiconductor manufacturing, where dust must be avoided and traveling in a narrow passage is inevitable and the work is performed vehicle avoiding vibration.

Figure 17:
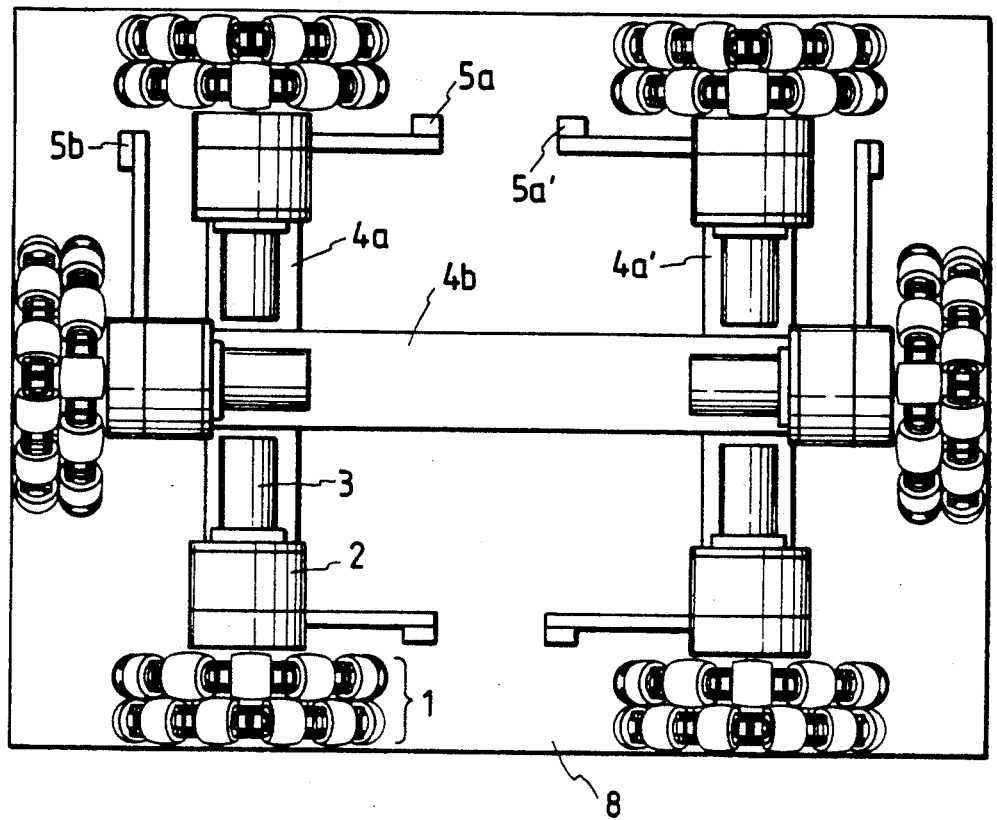
FIGS. 17 to 21 are diagrams showing alternative embodiments of the suspension mechanism of the present invention.

FIGS. 17 to 21 show different suspension mechanisms of the invention. In FIGS. 17 to 21, the wheel 1 schematically represented and the main chassis 8 is not shown. FIG. 17 shows an embodiment where a sub-chassis 4a and a sub-chassis 4a' are installed in parallel to each other, and the whole chassis is formed like the character "≠" of a Japanese Katakana letter or the cross of Lorraine. Swing arms 5a and 5a' are arranged opposing to each other. In this embodiment, the operation amount to determine the speed of the motor 3 is greater in comparison to the first embodiment and the grounding property for undulation of the floor is liable to be deteriorated a little, but since the area formed by the six wheels 1 is large, the stability to falling or tipping over is high, and since a large number of wheels 1 are provided, even if a one wheel 1 does not make proper ground contact, the straight running can be held with high ratio. Also structure of lattice shape such as "#" character known as the pound or number sign is possible.

Figure 18:
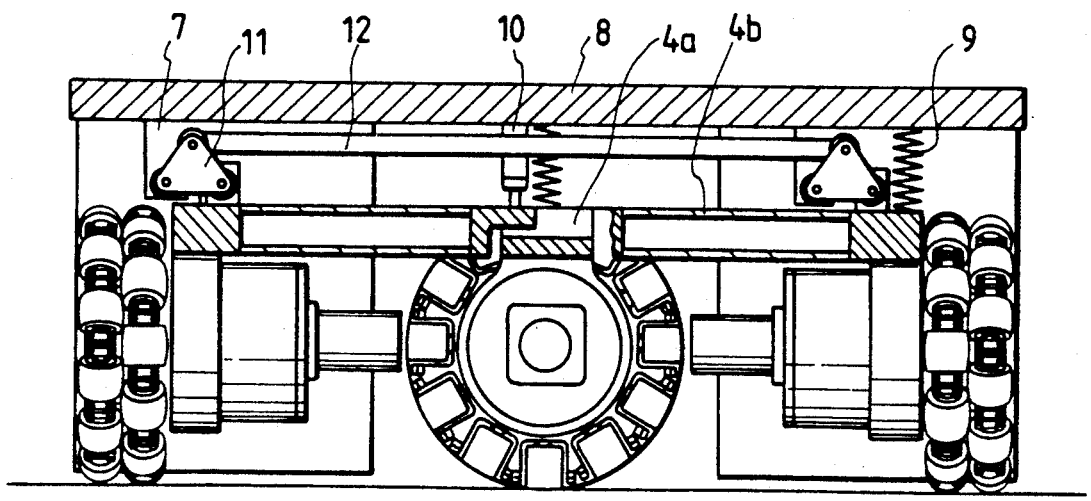
Figure 19:
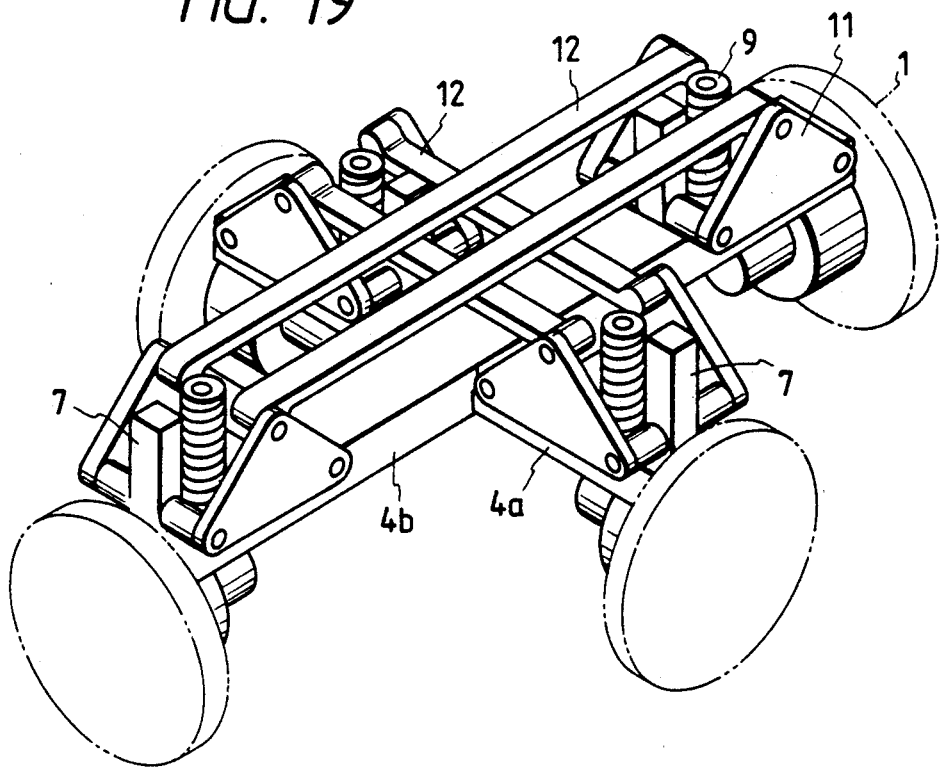

FIGS. 18 and 19 show an embodiment where sub-chassis 4a, 4b are realized by parallel links so as to act in parallel to a main chassis 8. In this embodiment, the sub-chassis 4a, 4b are connected to the main chassis 8 through a triangular link 11 by a rod 7. In this case, a pair of triangular links 11 are held by an intermediate rod 12 so as to hold the same rotational angle. Further since the attitude of the triangular link 11 in that the height of the junction of the triangular link 11 with the rod 7 is equal to that of the junction of the triangular link 11 with the sub-chassis 4a, 4b, swinging of the main chassis 8 in longitudinal and lateral directions accompanied with vertical motion of the sub-chassis 4a, 4b to the main chassis 8 becomes very small. Further in this embodiment, since the direction of the driving force of the driving wheel is perpendicular to the operation direction due to the suspension mechanism, an advantage exists in that the inertia force at an acceleration/deceleration state does not cause the traveling mechanism to sink. In this embodiment, the spring 9 and the damper 10 are similar to that shown in the first embodiment (see FIG. 3).

Figure 20:
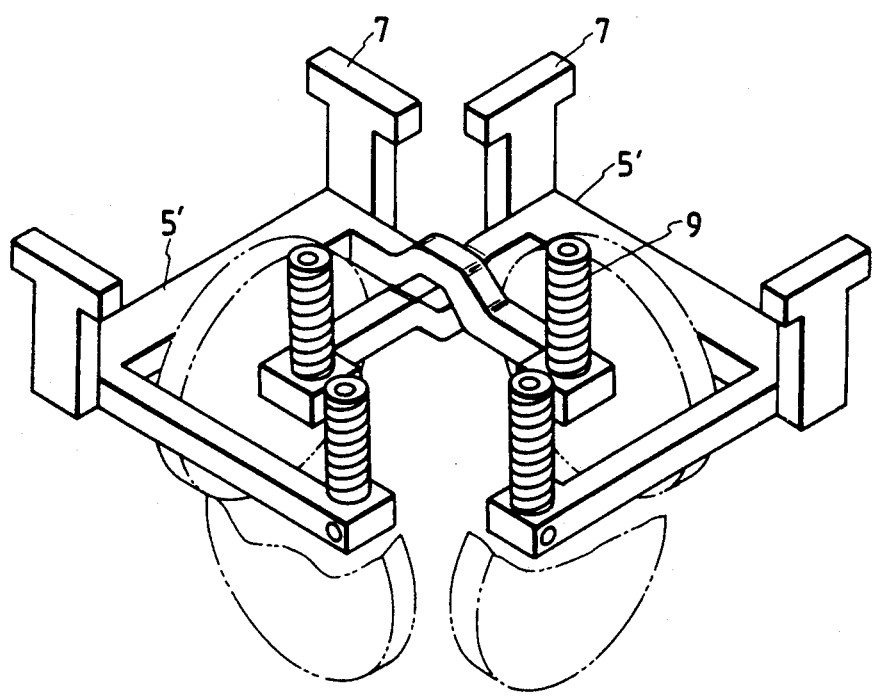

In the embodiment of FIG. 20, a sub-chassis 4 and a swing arm 5 are integrated and made a swing arm 5'. The swing arm 5' is constructed so as to go around one of the wheels which is not held by the swing arm 5', and the two driving wheels held by the swing arm are moved vertically by the same stroke. The rod 7 and the main chassis 8, the spring 9, the damper 10 (not shown) are similar to those in the first embodiment. Thereby the number of parts is reduced and the rigidity of the suspension mechanism is increased.

Figure 21:
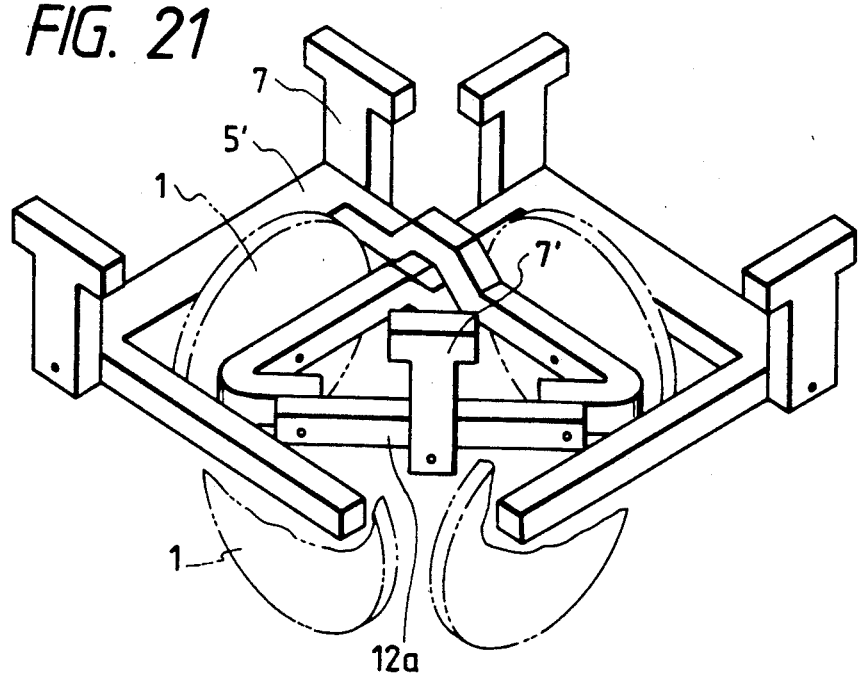

In the embodiment of FIG. 21, the spring 9 and the damper 10 are not used between the swing arm 5' and the main chassis 8 in the embodiment of FIG. 20, and in place of this, an intermediate rod 12a connecting the swing arm 5' and a fifth rod 7' between the center of the intermediate rod 12a and the main chassis 8 are installed. In this embodiment, the two swing arms 5' in crossing always perform operation to the main chassis 8 in the reverse direction and the same stroke. In this mechanism, such a state is prevented that any one among the wheels is floated or does not contact the floor due to unevenness of the floor surface and cannot be driven, and even if the load is varied, the height of the vehicle is not varied. According to the embodiment, since a spring or a damper is not used in the suspension mechanism, even when the vehicle is used with a heavy load, the bottoming of the suspension mechanism or the like is not produced, and even when the body weight is varied significantly, the followability of the wheels 1 to the floor surface is not liable to be inhibited. Also since the number of components is small, an advantage exists in that manufacturing is performed at low cost.

Figure 22:
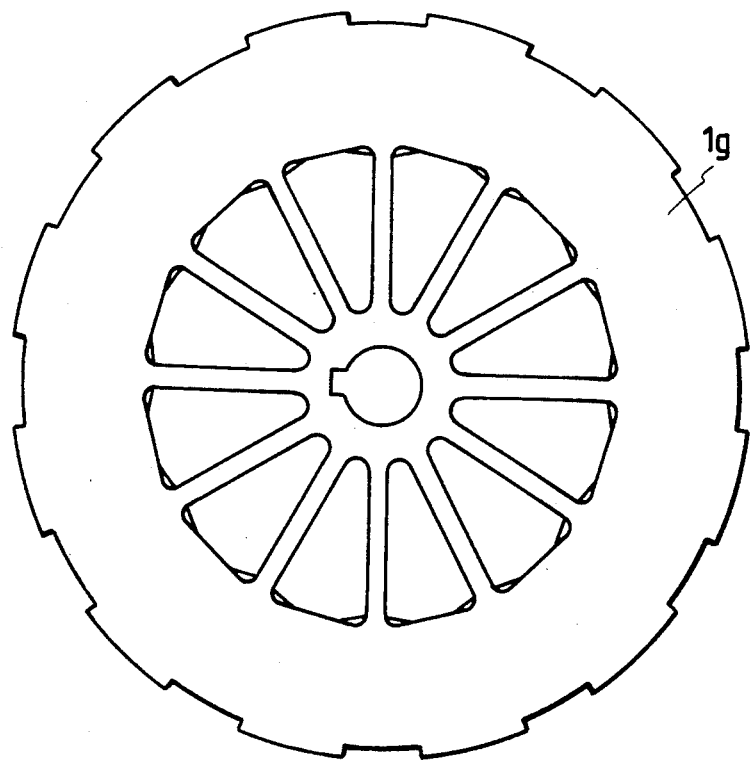
FIGS. 22 to 25 show alternative embodiments of the wheel of the present invention.
Figure 23:
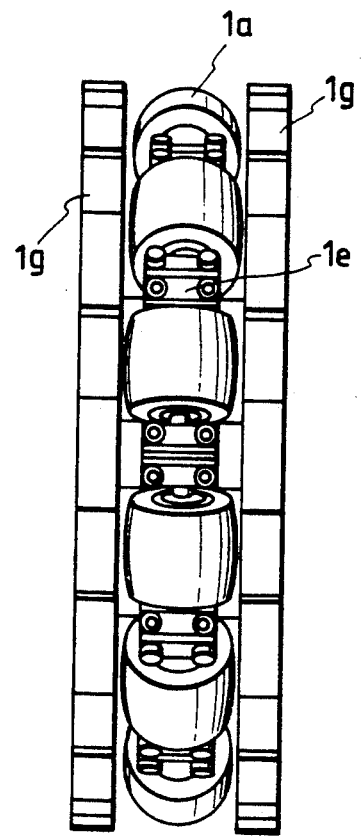

FIGS. 22 to 25 show modifications of the wheel 1 of the invention. FIG. 22 shows a ground contact ring 1g to be used in the case that the rollers 1a in the wheel 1 of the first embodiment are arranged not in a zigzag form but on one line. FIG. 23 shows the wheel 1 using ground contact rings 1g. In this embodiment, the property of the traveling mechanism being independent of the rotational angle of the wheel as in the first embodiment is lost partially. In this case, the position to enable changing from the straight advance to the lateral traveling is limited by the pitch of the rollers 1a, and also a limitation exists in that the followability to the running road during the straight advance can be corrected only within the range of the notched portion of the ground contact ring 1g. However, in the use that the straight advance is mainly intended and the followability to the running road is not strongly required, this embodiment is advantageous in that the number of the rollers 1a is decreased and the price is reduced.

Figure 24:
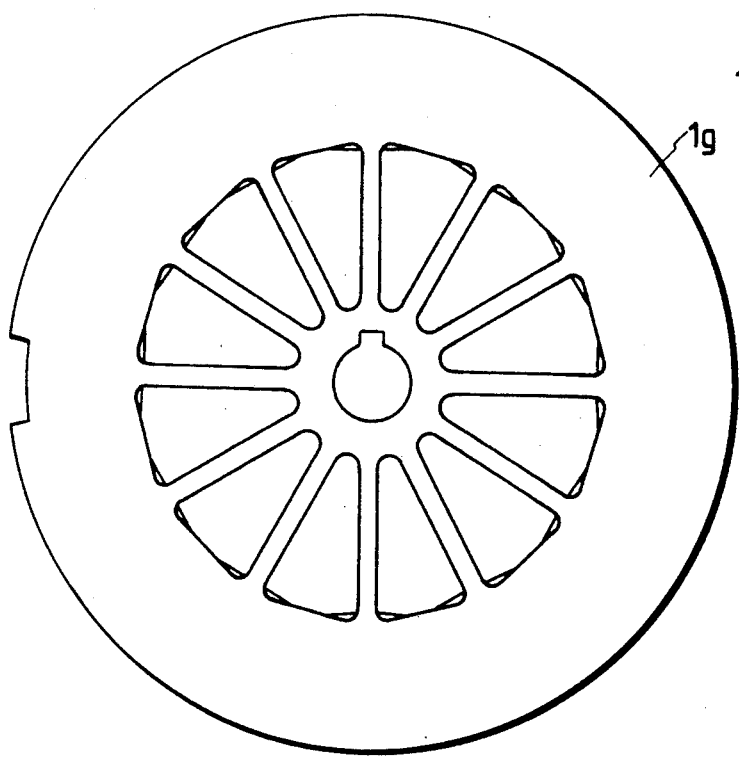
Figure 25:
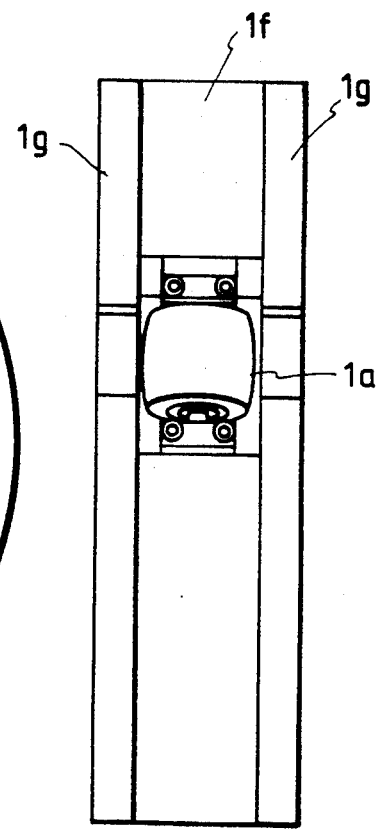

FIGS. 24 and 25 show an embodiment where the number of the rollers 1a is further limited, that is, the number of the rollers 1a is limited to one for one wheel 1. In this case, the limitation is further strengthened, but the embodiment is advantageous in that the advantage of the invention to enable the lateral traveling remains and the price can be further reduced.

Figure 26:
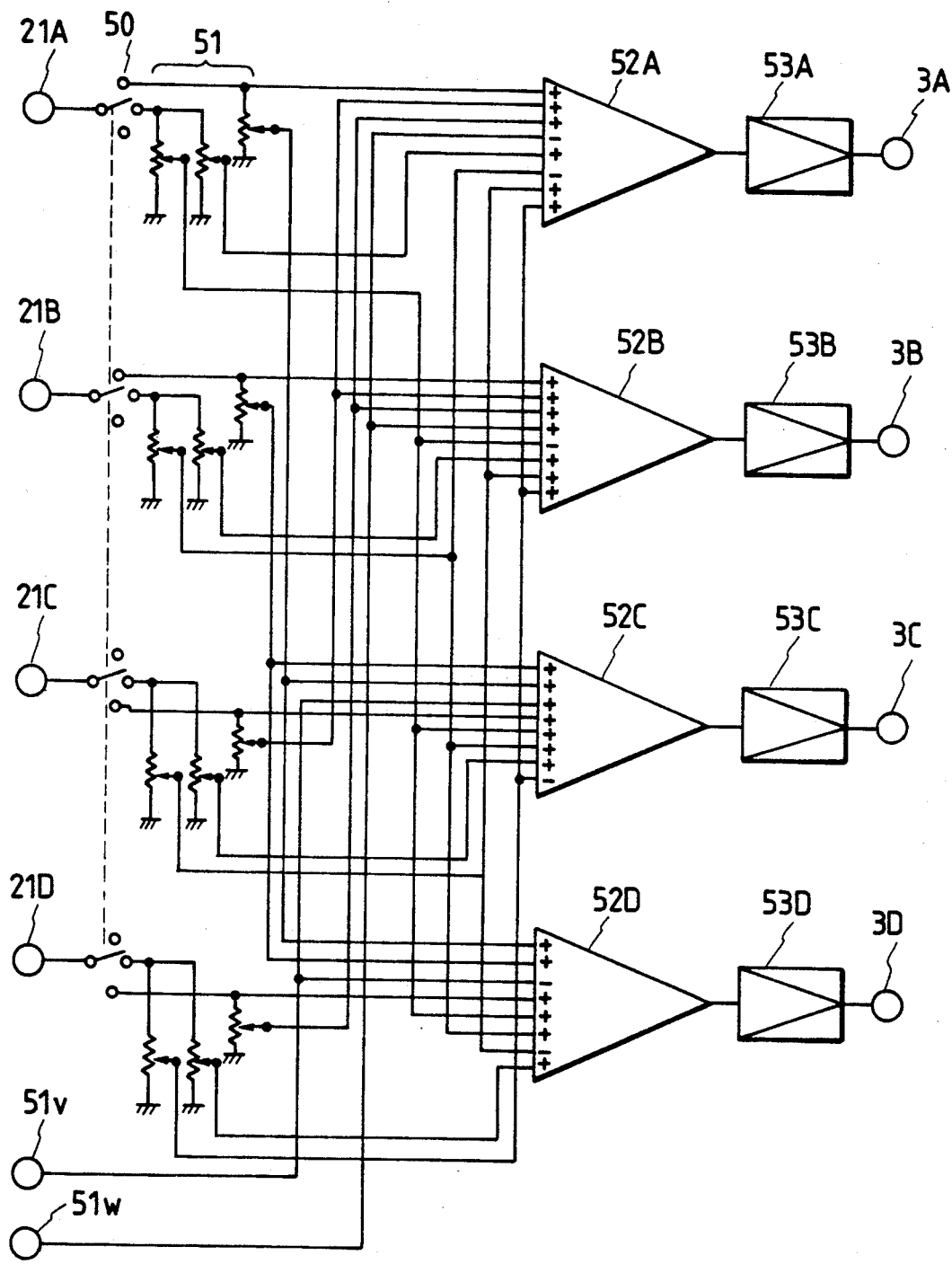
FIG. 26 is a block diagram showing another device for the present invention.

FIG. 26 shows an alternative modification where in order to reduce the operation time of the control device of the first embodiment, the operation is realized in circuit constitution. Outputs of sensors 21A to 21D are changed by a changing mechanism 50 of four circuits and three contacts into three types, i.e., the X direction advance state, the Y direction advance state and the definite point stop state, and then transmitted to an attenuator unit 51. Signals passing through the attenuator unit 51 and being distributed and attenuated are distributed, and further together with the vehicle target speeds v, w in the X and Y directions, are added by adders/subtractors 52A to 52D. Outputs from the adders/subtractors 52A to 52D are inputted as denied circumferential speeds of the wheels 1A to 1D into servo amplifiers 53A to 53D, and drive the motors 3A to 3D and the wheels 1A to 1D. According to the embodiment, the wheels 1A to 1D. According to the embodiment, the central processing unit 30 only operates the changing mechanism 50 thereby the operation can be simplified significantly, and since an analog control system is used, the embodiment is advantageous in that control at high speed becomes possible.

The following determinant (4) represents an embodiment where control in the first embodiment is simplified.

determinant (4)

$$\begin{bmatrix} A \\ B \\ C \\ D \end{bmatrix} = \begin{bmatrix} \frac{1}{2} & 1 & \frac{1}{2} & 0 & 0 & -1 \\ \frac{1}{2} & -1 & \frac{1}{2} & 0 & 0 & 1 \\ \frac{1}{2} & 0 & \frac{1}{2} & 1 & 1 & 0 \\ \frac{1}{2} & 0 & \frac{1}{2} & -1 & -1 & 0 \end{bmatrix} \begin{bmatrix} m \\ n \\ p \\ q \\ v \\ w \end{bmatrix}$$

$$= \begin{bmatrix} \frac{1}{2} & 1 & \frac{1}{2} & 0 & 0 & -1 \\ \frac{1}{2} & -1 & \frac{1}{2} & 0 & 0 & 1 \\ \frac{1}{2} & 0 & \frac{1}{2} & 1 & 1 & 0 \\ \frac{1}{2} & 0 & \frac{1}{2} & -1 & -1 & 0 \end{bmatrix} \begin{bmatrix} \frac{1}{2} & \frac{1}{2} & 0 & 0 & 0 & 0 \\ \frac{1}{2} & -\frac{1}{2} & 0 & 0 & 0 & 0 \\ 0 & 0 & \frac{1}{2} & \frac{1}{2} & 0 & 0 \\ 0 & 0 & \frac{1}{2} & -\frac{1}{2} & 0 & 0 \\ 0 & 0 & 0 & 0 & 1 & 0 \\ 0 & 0 & 0 & 0 & 0 & 1 \end{bmatrix} \begin{bmatrix} a \\ b \\ c \\ d \\ v \\ w \end{bmatrix}$$

$$= \frac{1}{4} \begin{bmatrix} 3 & -1 & 1 & 1 & 0 & -4 \\ -1 & 3 & 1 & 1 & 0 & 4 \\ 1 & 1 & 3 & -1 & 4 & 0 \\ 1 & 1 & -1 & 3 & -4 & 0 \end{bmatrix} \begin{bmatrix} a \\ b \\ c \\ d \\ v \\ w \end{bmatrix}$$

In the first embodiment, changing of the X direction advance state, the Y direction advance state and the definite point stop state is performed. In this case, a plurality of determinants (4) to be evaluated must be held and selection must be performed. Particularly, in the embodiment of FIG. 26, input signals of the adders/subtractors 52A to 52D are increased in number and the complication of the structure is inevitable. Consequently, the ON/OFF operation of the sensors 21A, 21B and the sensors 21C, 21D is performed separately and the control at the advance state and the stop state is unified, thereby the burden of the controller 20 (see FIG. 15) can be reduced. In this case, if v and w are zero, the determinant (4) is equal to the determinant (3). At the advance state to the X and Y directions, however, even if a non-relevant signal and the desired speed are ignored, the determinant (4) is not completely coincident with the determinant (1) and the determinant (2). That is, since the sensitivity to the angle deviation represented by m and p is reduced to a half, at the advance state to the X and Y directions using only one of m and p, the sensitivity to the angle deviation is lowered. In this vehicle, however, since the attitude during traveling is not always related to the traveling direction of the if the guide target exists within the effective range of the sensors 21A to 21D, the direction of the vehicle may be slanted. On the contrary, the rapid change of the attitude during traveling is, liable to deteriorate the straight traveling property of the vehicle and from this point of view, unification of the control is advantageous.

Further, as a modification of the control, the sensitivity to the angle deviation need not be made a value at the definite point stop state, but may be made any intermediate value between values at the advance state and the definite point stop state.

In the first embodiment, although one trace sensor is installed for one wheel, for example, eight trace sensors may be used for oblique traveling. If necessary, the CCD line sensor is not used as the trace sensor, but a number of single photo sensors are arranged on the periphery of the vehicle body and the sensor as a whole is used as a trace sensor, thereby limitation of the vehicle traveling directions may be omitted. Combination of the guide target 202 and the sensor 21 is not limited to that described in the first embodiment, but combination of a magnetic tape and a magnetic head, combination of a metal plate and a current collector, combination of a wall-surface or the like, of course, may be used. The guide target may be installed not only on a floor surface but also on a ceiling surface.

Further, depending on the capability of the central processing unit 30, the guide target 202 need not be continuous, but the guide target may be set onto the lattice points of regular intervals for example, and correction of the attitude and position is performed near the guide targets and an encoder is added to the motor 3 between the guide targets so as to enable the self-propelling of the vehicle.

When the suspension mechanism of the invention is used, the use is not limited to the wheel being movable in both directions as shown in FIG. 4, but may be applied to steering of a conventional wheel being movable in one direction. When the swing arms are crossed by the suspension a mechanism similar effect can be obtained even when the crossing is not orthogonal.

Figure 27:
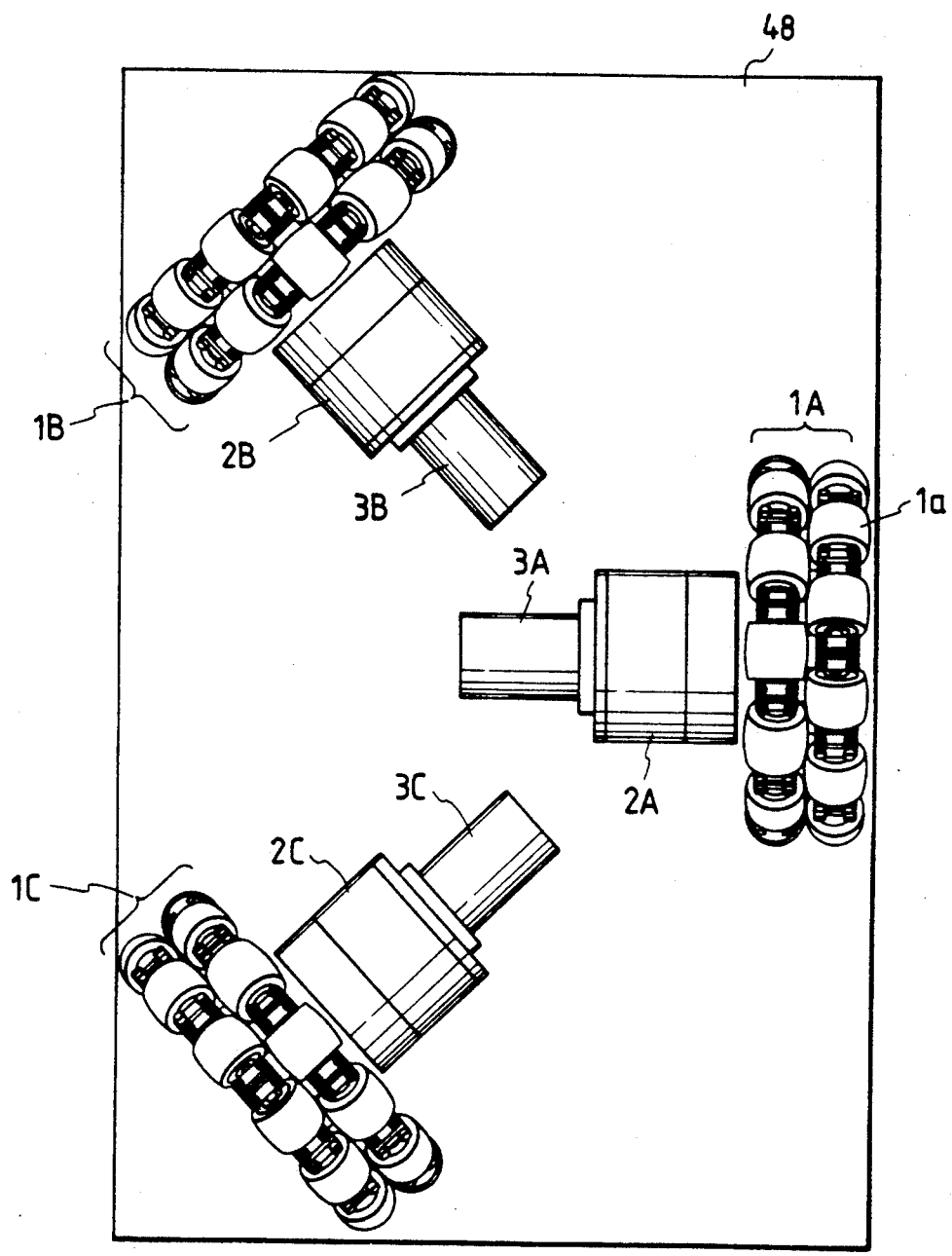
FIG. 27 is a bottom view showing an arrangement of these wheels in an embodiment of the self-propelled vehicle of the present invention.

In accordance with another embodiment of the invention, the self-propelled vehicle utilizes three wheels 1 as illustrated in FIG. 27. As shown, on a frame or chassis 8 of the vehicle are mounted three sets of motors 3, reduction gears 2, and wheels 1. Since the wheel 1 has a structure that a plurality of rollers with the rotary axis being in the circumferential direction of the wheel are arranged on plural lines at the periphery thereof, any roller is grounded irrespective of the rotational angle of the wheel 1, whereby the wheel 1 can be moved in the direction perpendicular to the rotational direction of the wheel 1, and by combination of the rotation of the wheels, the straight advance, the lateral traveling and rotation can be realized at any ratio simultaneously.

Since the self propelled vehicle is constituted by three wheels, in comparison to the case of constitution by four or more wheels, even if a suspension mechanism is not installed, the wheels can be prevented from being floated or not making proper ground contact due to unevenness of the road surface.

Also in the embodiment, since one wheel 1 is installed at each of both ends of a major side of the rectangular frame or chassis 8 and another wheel 1 is installed at the center point of another major side, even if the center of gravity is moved in wide range near the center of the chassis 8, the vehicle does not tip or fall over. On the contrary, if one wheel 1 is installed at each of both ends of a minor side and another wheel 1 is installed at the center point of another minor side, the triangle constituted by the grounding points of the wheels 1 in a range where the center of gravity can be moved, becomes a slender isosceles triangle thereby the vehicle is liable to fall over in the lateral direction.

Figure 28:
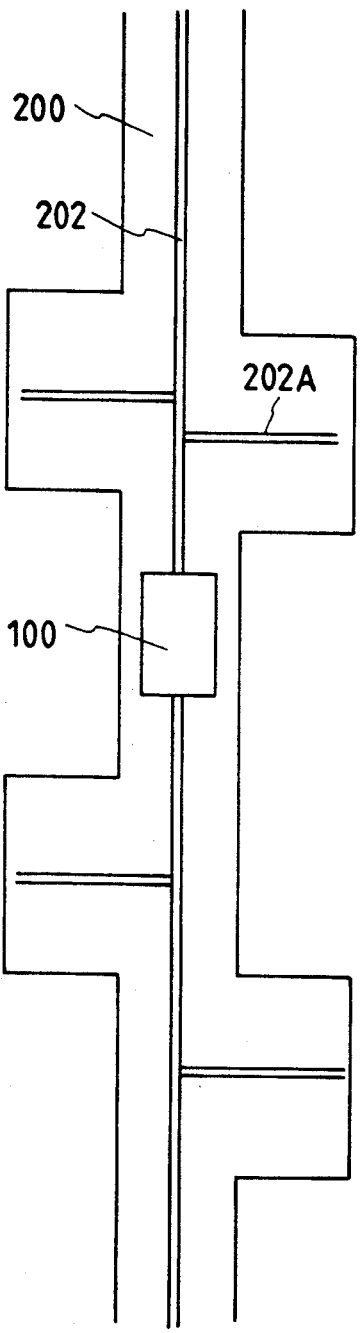
FIG. 28 is a layout diagram in a factory where the vehicle in FIG. 1 is utilized.

FIG. 28 shows the vehicle 100 traveling on a passage 200 with a sidetrack for a work station or the like wherein a processing line of a factory such as a semiconductor manufacturing line in general includes a longitudinal direction as shown in FIG. 28. In this connection, as shown in FIG. 27, since one wheel 1 has a rotary plane in the longitudinal direction of the chassis 8 and the two remaining wheels 1 are arranged obliquely with respect thereto, regarding the longitudinal direction of the vehicle when more acceleration is required, the power of the three motors 3 to drive the three wheels 1 is entirely effectively used, and at the lateral traveling state where more acceleration is not required, the two motors 3 of the wheels 1 arranged obliquely perform driving. Consequently, a margin is provided for the selection of the power of the motors 3.

Further regarding the passage 200 in FIG. 28, since no wheel 1 is opposed to the longitudinal direction of the passage, such a state can be prevented that a specific roller among rollers of the wheels 1 is grounded for a long time and becomes more abraded.

In the wheel 1 of FIG. 27 in general, for the traveling speed v of the chassis 8 or the vehicle, if an angle formed between the rotational plane of the wheel 1 and the traveling direction is made $\theta$, a relation of $\omega = v_{cos}\theta$ is satisfied for the circumferential speed of the wheel 1. In this case, since the angle of a wheel arranged obliquely with respect to the chassis in FIG. 27 is 45 degrees, when the traveling direction of the vehicle is the straight advance and lateral traveling, $\cos\theta$ becomes $1/\sqrt{2}$ in any case. If the maximum speed $\omega_{max}$ is equal in the straight advance and the lateral traveling, $\omega_{max}$ becomes equal for both, thereby the degree of freedom to select the motors 3 becomes higher and the control is simplified.

The control in the case of the wheel arrangement of FIG. 27 will be described as follows. When the circumferential speeds of the wheels 1A to 1C are made $\omega_a - \omega_c$ and the chassis advances in the longitudinal direction at the speed v, if the angles formed between the rotational planes of the wheels 1A to 1C and the longitudinal direction are made $\theta_a - \theta_c$, the following determinant (5) is satisfied.

$$\begin{bmatrix} A \\ B \\ C \end{bmatrix} = v \cdot \begin{bmatrix} \cos\theta_a \\ \cos\theta_b \\ \cos\theta_c \end{bmatrix} \tag{5}$$

Also if the lateral traveling speed is made u, the following determinant (6) is satisfied.

$$\begin{bmatrix} A \\ B \\ C \end{bmatrix} = u \cdot \begin{bmatrix} \sin\theta_a \\ \sin\theta_b \\ \sin\theta_c \end{bmatrix} \tag{6}$$

On the other hand, if the rotational angle speed of the chassis is made $\omega$, distances from the center of the chassis 8 to the respective wheels 1 are made la–lc, and the angles formed between la–lc and the rotational planes of the wheels 1 are made $\rho_a - \rho_c$, the following determinant (7) is also satisfied.

$$\begin{bmatrix} A \\ B \\ C \end{bmatrix} = w \cdot \begin{bmatrix} la \cos a \\ lb \cos b \\ lc \cos c \end{bmatrix} \tag{7}$$

If the determinants (5)–(7) are assembled into one, the following determinant (8) is satisfied.

$$\begin{bmatrix} A \\ B \\ C \end{bmatrix} = (v, u, w) \begin{bmatrix} \cos\theta_a & \sin\theta_a & la\cos\rho_a \\ \cos\theta_b & \sin\theta_b & lb\cos\rho_b \\ \cos\theta_c & \sin\theta_c & lc\cos\rho_c \end{bmatrix} \tag{8}$$

In this case, since $\theta_a - \theta_c$, a are known, if these are substituted, it follows that determinant (9) is obtained.

$$\begin{bmatrix} A \\ B \\ C \end{bmatrix} = (v, u, w) \begin{bmatrix} 1 & 0 & la \\ 1/\sqrt{2} & 1/\sqrt{2} & lb\cos\rho_b \\ 1/\sqrt{2} & 1/\sqrt{2} & lc\cos\rho_c \end{bmatrix} \tag{9}$$

According to the determinant (9), the control system of the vehicle of the embodiment can be separated into three degrees of freedom, the straight advance, the lateral traveling and the spin. If the control during the straight advance is taken as an example, v becomes the traveling target speed of the vehicle, and u, $\omega$ are determined by following formulas for the lateral deviation v and the angular deviation $\phi$ of the vehicle measured by the sensor 21.

$$u = k_1 v + k_2 \dot{v} + k_3 \int v \, dt \tag{10}$$

$$\omega = k_4 \phi + k_5 \dot{\phi} + k_6 \int \phi \, dt \tag{11}$$

If $k_1 - k_6$ are made suitable values, the control method is determined. A similar relation is satisfied also at lateral traveling state and at an oblique traveling state. At the oblique traveling state, for the vector $$\frac{1}{u^2 + v^2} (v, u)$$

to determine the traveling direction by ratio of u, v, the vector $$\frac{1}{\frac{1}{u^2} + \frac{1}{v^2}} \left(\frac{1}{u}, \frac{1}{v}\right)$$

in the orthogonal direction may be made the deviation amount.

Figure 29:
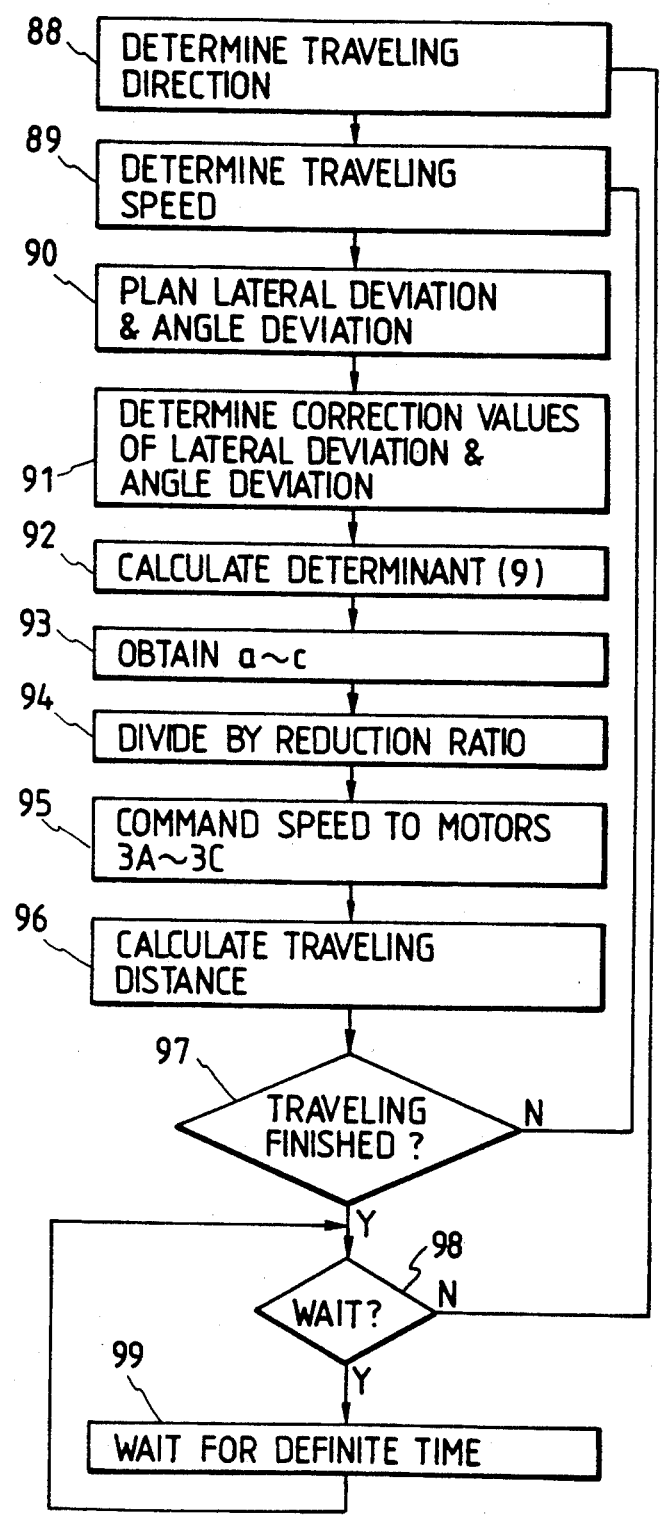
FIG. 29 is a flow chart of control method of the three-wheeled embodiment.

FIG. 29 is a flow chart showing the above-mentioned control method. Since the content of FIG. 29 is apparent, the description is omitted.

Figure 30:
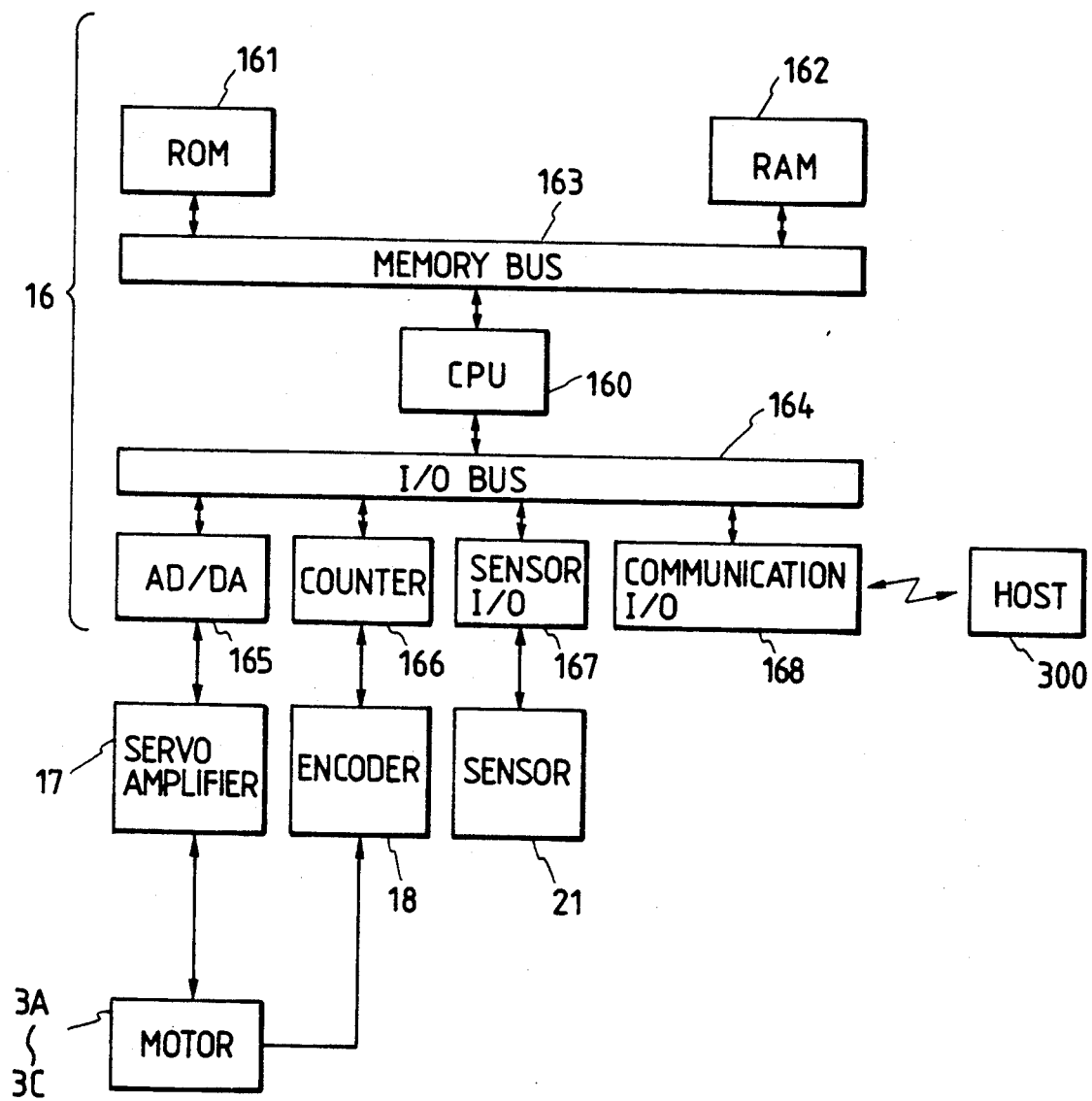
FIG. 30 is a block diagram of a control device for the three-wheeled embodiment.

FIG. 30 shows a control device 16 which realizes the control direction shown in FIG. 29. A CPU 160 can read or write to a ROM 161 and a RAM 162 through a memory bus 163. The control method shown in FIG. 29 can be realized as a program recorded in the ROM 161, and data at the midway of calculation is recorded in the RAM 162. On the other hand, the CPU 160 is connected through an I/O bus 164 and further through an AD/DA 165, a counter 166, a sensor I/O. 167 and a communication I/O bus 16B to a servo amplifier 17, an encoder 18, a sensor 21, a host 300 and the like. Thereby the CPU 160 can measure the position and the attitude of the self propelled vehicle 100 using the sensor 21, and can measure the traveling distance using the encoder 18. Using these measuring results, the CPU 160 can control the rotational speed of the servo motors 3A-3C through the servo amplifier 17. Also the CPU 160 communicates with the host 300 through the communication I/O bus 168 to thereby perform the work command from the host 300 and to report the work to the host 300.

As to this embodiment of the invention, the invention can be realized also by modifying similar functions. Regarding the arrangement of the wheels, since the traveling speed of the vehicle 100 is made the same both in the straight advance and in the lateral traveling, the wheels 1B, 1C are directed in +45 degrees and −45 degrees with respect to the longitudinal direction of the chassis 8. However, if the straight advance speed and the lateral traveling speed are different, the angle may be changed. Although the wheels are arranged at both ends of one major side of the chassis 8 and at the center of another major side, if the straight advancing property at the acceleration state to the longitudinal direction of the chassis 8 is regarded as important, a reverse arrangement may be made.

Also regarding the control direction, when the arrangement of the wheels is changed, similar control can be realized using determinant (8). Further regarding the evaluation of determinant (8) or (9), simplification can be performed. If the traveling direction of the vehicle 100 is limited to the longitudinal direction and the lateral direction, for example, and traveling to the oblique direction is not performed, calculation of the traveling direction of the chassis 8 can be reduced. In addition, parallel sliding in the direction perpendicular to the traveling direction need not be performed, but the position deviation can be corrected also by varying the direction of the chassis 8 by rotation.

Additionally, while the above-description has indicated that the operation is executed by a digital computer, such operation can be effected by an analog circuit or the like, wherein the frequency response of the control system can be improved and therefore such is suitable for the case requiring high speed traveling.

Figure 31:
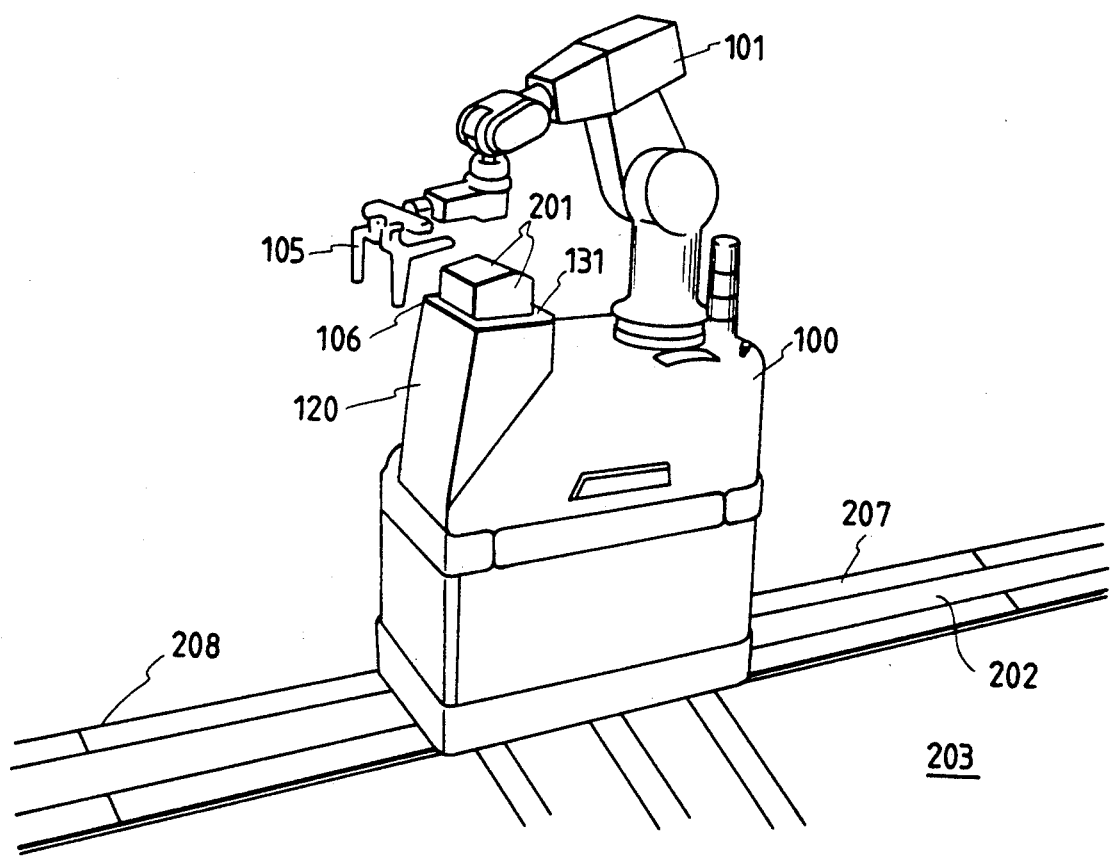
FIG. 31 is a perspective view showing an embodiment of the self-propelled vehicle with a vibration preventing base arrangement of the present invention.

Another embodiment of the invention will now be described by reference to FIG. 31 which is a perspective view showing the vehicle 100 with a vibration preventing mechanism. The self propelled vehicle is provided with two units of vibration preventing bases 120, and a mounting base 130 is installed on upper surface of each of the vibration preventing bases 120. The vehicle is also provided with a robot arm 101 as a transfer mechanism, and the robot arm 101 is provided with a grasping mechanism 105 having suitable shape for grasping a substance 201 to be carried. The substance 201 is mounted on the mounting base 130 while the vehicle moves. A pressure plate 131 with a depression similar to the shape of the substance 201 is installed on the surface of the mounting base 130, and the substance 201 is fixed to the mounting base by the depression of the pressure plate 131. The vehicle is moved on a traveling surface 207 in the form of rails or the like and is guided along the guide target 202. Since the vibration preventing base has the function of preventing the mounting base 130 from being vibrated, for example, when the traveling surface 207 has seams 208 with different heights of the seams and the vehicle passes over the seams 208. Even if the vehicle is vibrated, the mounting base 130 is scarcely vibrated and the vibration is not transmitted to the substance 201.

In a semiconductor manufacturing process, since even a small amount of abrasion powder may cause a defective state of the semiconductor, sliding must be avoided and therefore during manufacturing, a wafer is carried in an enclosed state in a cassette made of tetrafluoroethylene or polypropylene. Although such material is soft and therefore is not liable to damage the wafer, the material has a low coefficient of friction and the wafer is moved even with a small amount of vibration. For example, in the case of tetrafluoroethylene, the static friction coefficient with metal at a low load is about 0.1. Consequently, as described above in relation to problems to be solved by the invention, the vibration acceleration must be suppressed to 0.1 G (about 1 m/s$^2$) or less.

Figure 32:
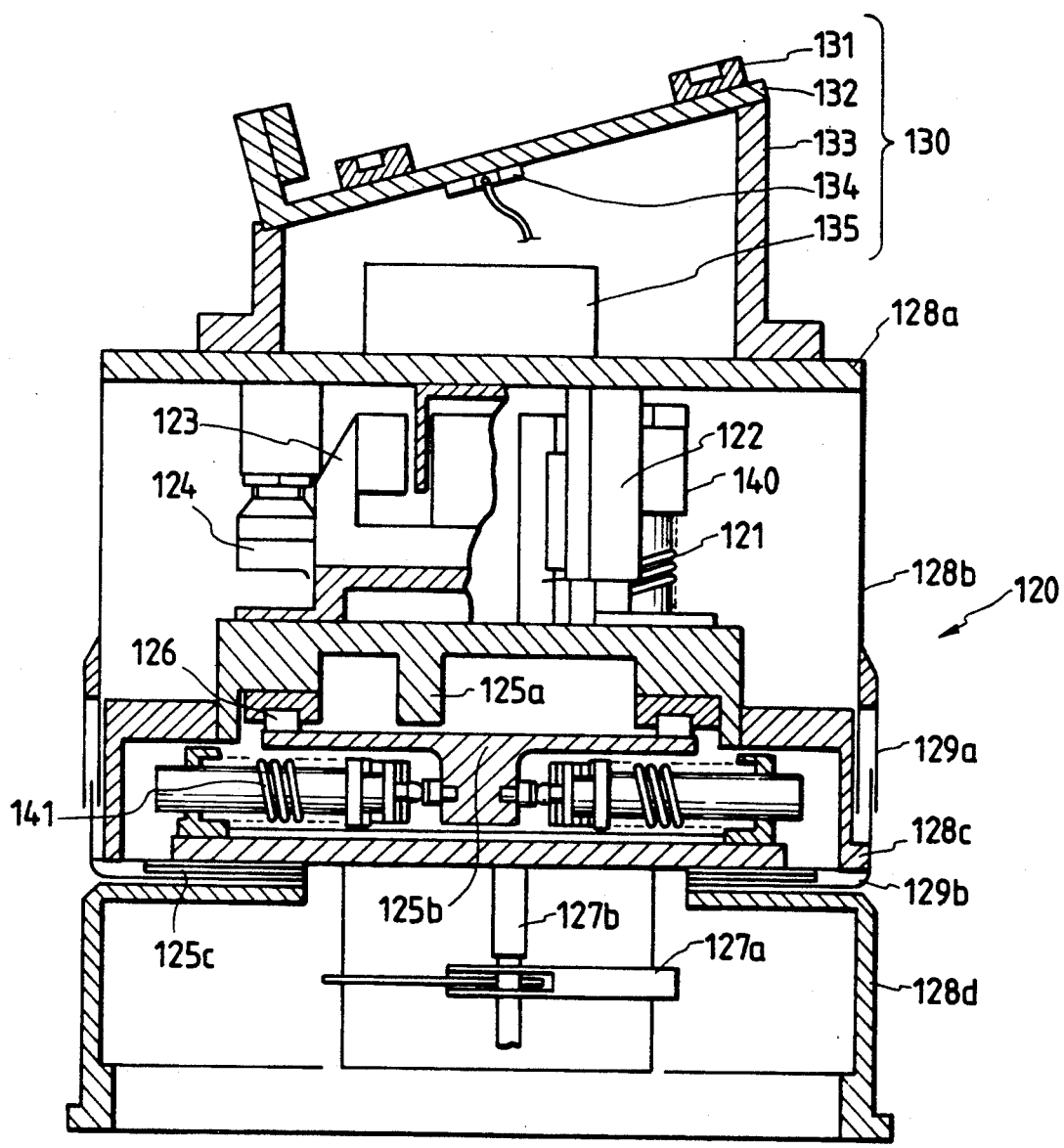
FIG. 32 is a longitudinal sectional view showing the vibration preventing base.

FIG. 32 is a longitudinal sectional view of a set of the vibration preventing base 120 and the mounting base 130 of the invention. An upper plate 128a and a side plate 128b of the vibration preventing base 120 are supported so as to be movable vertically by a spring 121 and a guide 122 which are moved vertically. Further, a movable coil of a DC motor such as a voice coil motor 123, an acceleration sensor 140 and a position sensor 124 are mounted on the upper plate 128a. The spring, 121, the guide 122 and a field generating member of the voice coil motor 123 are mounted on a stage 125a movable in a horizontal direction perpendicular to the plane of the paper. At the lower side of the stage 125a is installed a stage 125b which has a similar construction and is movable in the lateral direction within the plane of the paper and is mounted on a stationary member 125c. The stationary member 125c is mounted on a base 128d. Each of the stages, 125a and 125b is mounted on each lower part by a guide 126 supporting each stage in the moving direction and a spring 141. According to the mechanism, by combination of parts from the stage 125a to the spring 141 the stage 125a 25a can be moved relatively to the base 128d softly. Since the natural frequency of the vibration preventing base 120 determined by the total mass of the mounting base 130 and a vibrating body such as the substance 201 and the spring constant of the spring 121 is suppressed lower than $1\sqrt{2}$ of the natural or proper frequency of the self propelled vehicle 100, which represents the lowest natural resonant frequency of the system or vehicle and which is determined by the mass of the vehicle and the rigidity of the vehicle, the vibration accompanying with the traveling of the vehicle can be effectively interrupted. In the embodiment, the natural frequency of the vehicle is designed to be 14 Hz whereas the natural frequency of the vibration preventing base 120 is designed to be 3.6 Hz, and a sufficient vibration preventing effect is obtained for the vibration of 14 Hz or more where almost all of the vibration energy of the vehicle 100 is distributed.

However, when undulation exists in the traveling surface 203 or rails 207, for example, and vibration of a low frequency is supplied to the vehicle, the vibration is generated even at the natural frequency of the vehicle or less. In this case, for vibration of $\sqrt{2}$ times or less of the natural frequency of the vibration preventing base 120, the vibration preventing base constituted by only the passive mechanical parts is not effective and the vibration near the natural frequency of the vibration preventing base 120 is rather amplified. In order to prevent the low frequency vibration, an active vibration preventing mechanism is used. However, since the active vibration preventing mechanism has a large energy loss, as much vibration energy as possible is preferably absorbed by the passive vibration preventing mechanism. From this point of view, the natural frequency of the vibration preventing base 120 must be made as low as possible. On the other hand, in order to make the natural frequency low, the total mass of the vibrating body must be made low or the spring constant of the spring 121 must be made low. However, if excessively heavy dead weight is held on the mounting base 130 and the mass is increased, the size of the vehicle is made large and the space efficiency becomes bad and this state is not preferable also from the view point of the consumption of power. If the spring constant is lowered only, the position of the substance is liable to be varied and the accuracy becomes bad during the transfer. Particularly regarding the vertical vibration, influence of the mass variation of the substance 201 affecting the position accuracy is large. For example, in the semiconductor manufacturing process, since how many sheets of wafer are enclosed in the wafer cassette 201 is varied depending on the lot, the mass of the substance 201 is varied. Therefore the sinkage amount of the substance 201 is varied depending on the lot, and the substance 201 may not be able to be grasped by the robot arm 101. Consequently, in order to raise the position accuracy of the substance during the transfer, the positioning mechanism is installed.

The positioning in the vertical direction is performed utilizing a voice coil motor as hereinafter described. The positioning in the longitudinal and lateral directions is performed by mechanical positioning. A pin 127b extends downward from the stage 125a, and can be grasped by a grasping device 127a fixed to the base 128d. The grasping device 127a grasps the pin 127b so that the stage 125a is fixed to the base 128d. In this case, since a portion of the pin 127b grasped by the grasping device is constituted by soft material with good sliding ability, the vibration generated at the grasping state is small.

A side plate, 128c is fixed to the stage 125a, and is moved longitudinally together with the stage 125a. The side plate 128c together with the side plate 128b and the base 128d constitutes a labyrinth 129a and a labyrinth 129b, respectively. Further, since the inside of the vibration preventing base 120 is reduced in pressure, even if dust is generated within the vibration preventing base 120, the dust does not leak towards the mounting base 130.

A balancer weight 135 and a leg 133 are mounted on the upper plate 128a of the vibration preventing base 120. An upper plate 132 of the mounting base is mounted on the leg 133, and further a work sensor 134 and a pressure plate 131 which is depressible are installed so as to constitute the mounting base 130.

According to the above-mentioned construction, the vibration preventing base 120 can prevent the vibration in three-axis directions, the vertical, longitudinal and lateral directions. Since the vibration in the vertical direction may be prevented in order to prevent the substance from sliding, the embodiment adopts the vibration preventing mechanism together with the active elements for the vertical direction and the vibration preventing mechanism by the passive elements only for the longitudinal and lateral directions. The vibration preventing in the vertical direction and the positioning being particularly important in the embodiment will be described further in detail.

Figure 33:
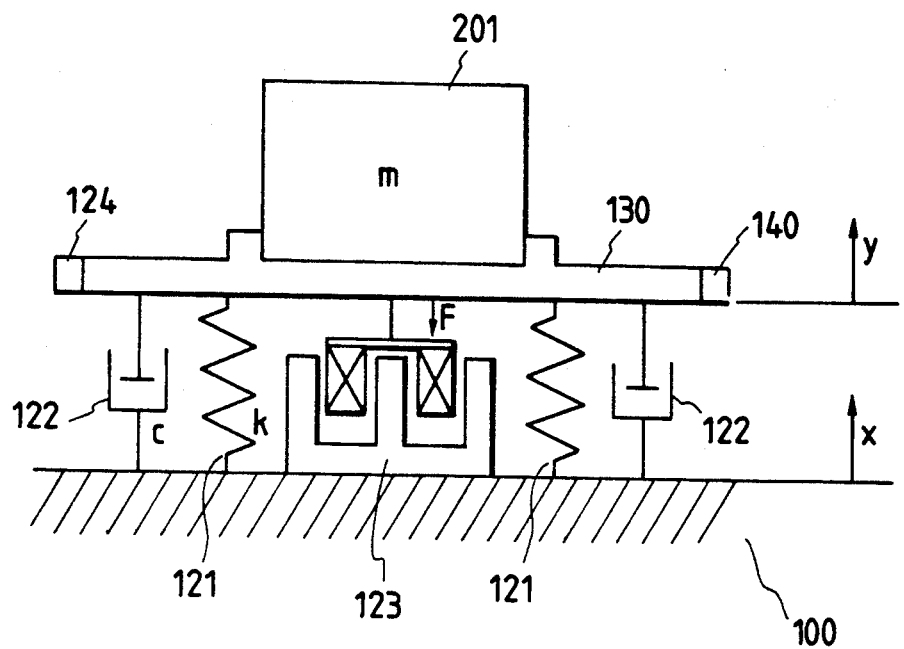
FIG. 33 is a diagram of an active vibration preventing mechanism used for vibration preventing in an important direction of the vibration preventing base of the present invention.

FIG. 33 is a diagram showing the vibration preventing mechanism in the vertical direction of the vibration preventing base 120 of the invention. Parts to support the mounting base 130 are the spring 121, the guide 122 and the voice coil motor 123. In the guide 122, for the vertical vibration component, the drive resistance component together with the friction component to the surrounding air acts as a damper. Vibration of the self propelled vehicle 100 during the carrying vibrates the mounting base 130 and the substance 201 to be carried through the spring constant k of the spring 21 and the damping c of the guide 122. The vibration is measured by the acceleration sensor 140, and in order to generate thrust Fvcm in the direction to eliminate this vibration, current flows through the voice coil motor 123. On the other hand, the position of the mounting base 130 is measured by the position sensor 124 during the transfer, and in order to generate the thrust Fvcm in the direction to eliminate the position deviation, current flows through the voice coil motor 123. The acceleration sensor 140 can measure the acceleration of the substance to be carried for the complete system. That is, using the acceleration sensor, even if the vehicle itself is vibrated, the substance to be carried can be controlled so that it is scarcely vibrated with respect to a virtual stationary point, in other words, the earth.

Particularly, when values of the acceleration sensor are integrated, a function as a damper (also called "sky hook damper") for the virtual stationary point can be obtained. This function, in comparison to usual passive vibration preventing, has effects particularly for the vibration in the low frequency range.

Figure 34:
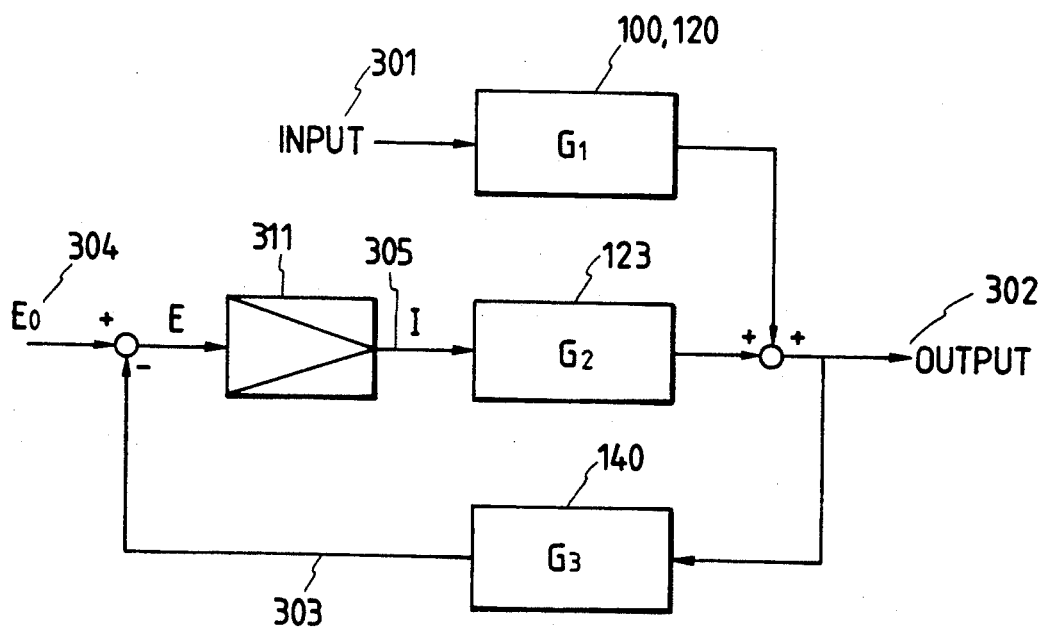
FIGS. 34 and 35 are diagrams showing two systems of control of the vibration preventing mechanism of the present invention.

FIG. 34 is a block diagram showing operation of a control unit of the vibration preventing mechanism in the vertical direction of the vibration preventing base of 130 of the invention. Vibrating force 301 of the vehicle received from the rails 207 vibrates the acceleration sensor 140 and the substance 201 to be carried through the vehicle 100 and the vibration preventing base 120. This vibration, as vibration acceleration 302, is converted by the acceleration sensor 140 into a voltage signal 303, and subtracted from a reference voltage 304 ($E_O$), and converted by a proportional integral amplifier 311 into current 305 and inputted to the voice coil motor 123, and drives the voice coil motor 123 so as to eliminate the vibration. In this case, since the acceleration sensor 140 is used for detecting the vibration, its inverted amplified output has a function of increasing the virtual mass of the vibrating body and decreasing the natural frequency and its inverted integral output has a function of eliminating the acceleration to the inertia coordinates system of the vibrating body. Therefore in comparison to the vibration preventing mechanism constituted by only passive parts, only, the vibration applied to the substance 201 becomes small.

Figure 35:
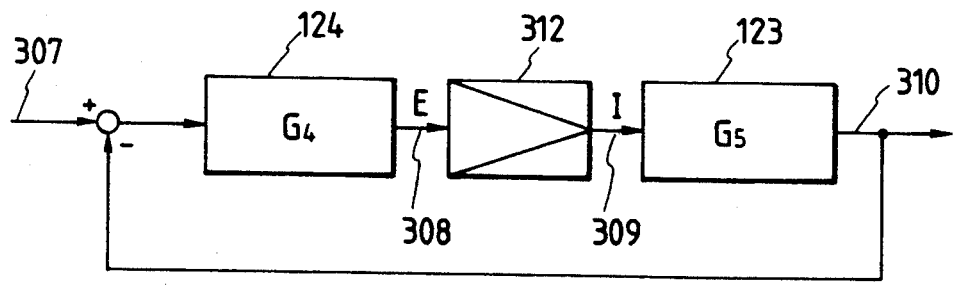

FIG. 35 is a block diagram showing operation of a control unit of the positioning mechanism in the vertical direction of the vibration preventing base 120 of the invention. Since the vibration source such as wheels acts during traveling of the self propelled vehicle, the vibration preventing function is the more important, but since the vibration source does not act after finishing the carrying and during the transfer, the positioning function become more important than the vibration preventing function at such time. If the positioning function is bad, the loading of the substance by the vehicle or the transfer mechanism such as a robot arm installed on the ground becomes difficult, and unnecessary vibration is supplied to the substance to be carried due to the mishandling. Consequently, the vehicle is made to be stationary, thereby the vibration preventing function which becomes less important is stopped, and the voice coil motor 123 in use for the active vibration preventing is used for positioning. Position 310 of the substance 201 to be carried is detected as displacement from reference position 307 by the position sensor 124 and converted into a voltage signal 308, and is converted by PID amplifier 312 into a current 309 and inputted to the voice coil motor 123, and drives the voice coil motor so as to eliminate the deviation. In this case, since the voice coil motor 123 is used for correcting the deviation, in comparison to the case using the mechanical positioning mechanism for chucking the pin, generation of vibration caused by a large acceleration due to rigid contact can be prevented. Further since the voice coil motor 123 is used for the active vibration preventing and for the positioning, if necessary, the mechanism can be made light weight and the load of the vehicle as the moving body can be reduced.

Since the vibration preventing mechanism and the positioning mechanism are provided as above described, in comparison to the vibration preventing mechanism constituted by passive mechanical parts only, the resonance frequency is lowered but stable positioning is possible for a variation of the mass of the substance to be carried.

Figure 36:
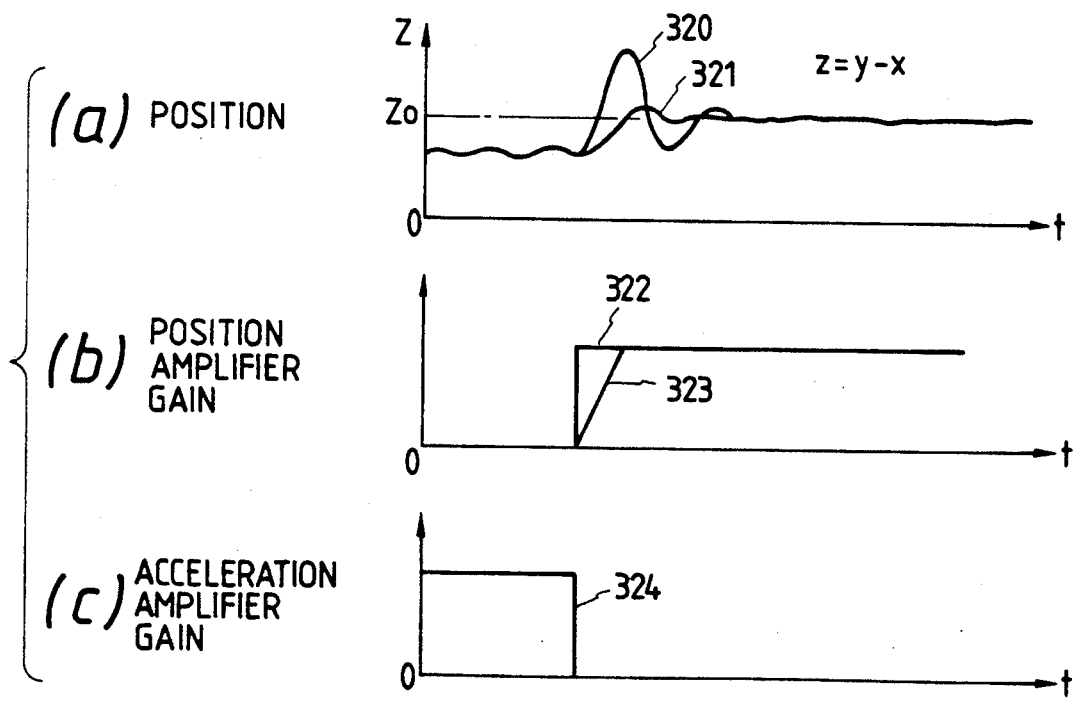
FIGS. 36(a)-(c) are diagrams illustrating problems of vibration generation at the changing state of control of the vibration prevention.

Even in the case of using the voice coil motor 123 in the vibration preventing mechanism, however, if mode changing is performed without any consideration of the vibration preventing operation and the positioning operation, vibration will be generated at the changing state. FIGS. 36(a-c) are diagrams showing that the mode changing of the control method of the vibration preventing base 120 of the invention may cause generation of the vibration. When the signal is changed rapidly from the vibration preventing mode to the positioning mode, the acceleration sensor amplifier gain or sensitivity 324 rapidly becomes zero as shown in diagram (c) and the vibration suppressing effect is lost. If the position sensor amplifier gain or sensitivity 322 rises rapidly as shown in diagram (b), rapid positioning occurs for correcting the position deviation and the position is vibrated as shown in waveform 320 in diagram (a). Therefore if the position sensor amplifier gain or sensitivity is raised gradually as shown in 323 in diagram (b), the vibration is suppressed and the position becomes the waveform of 312 in diagram (a).

Figure 37:
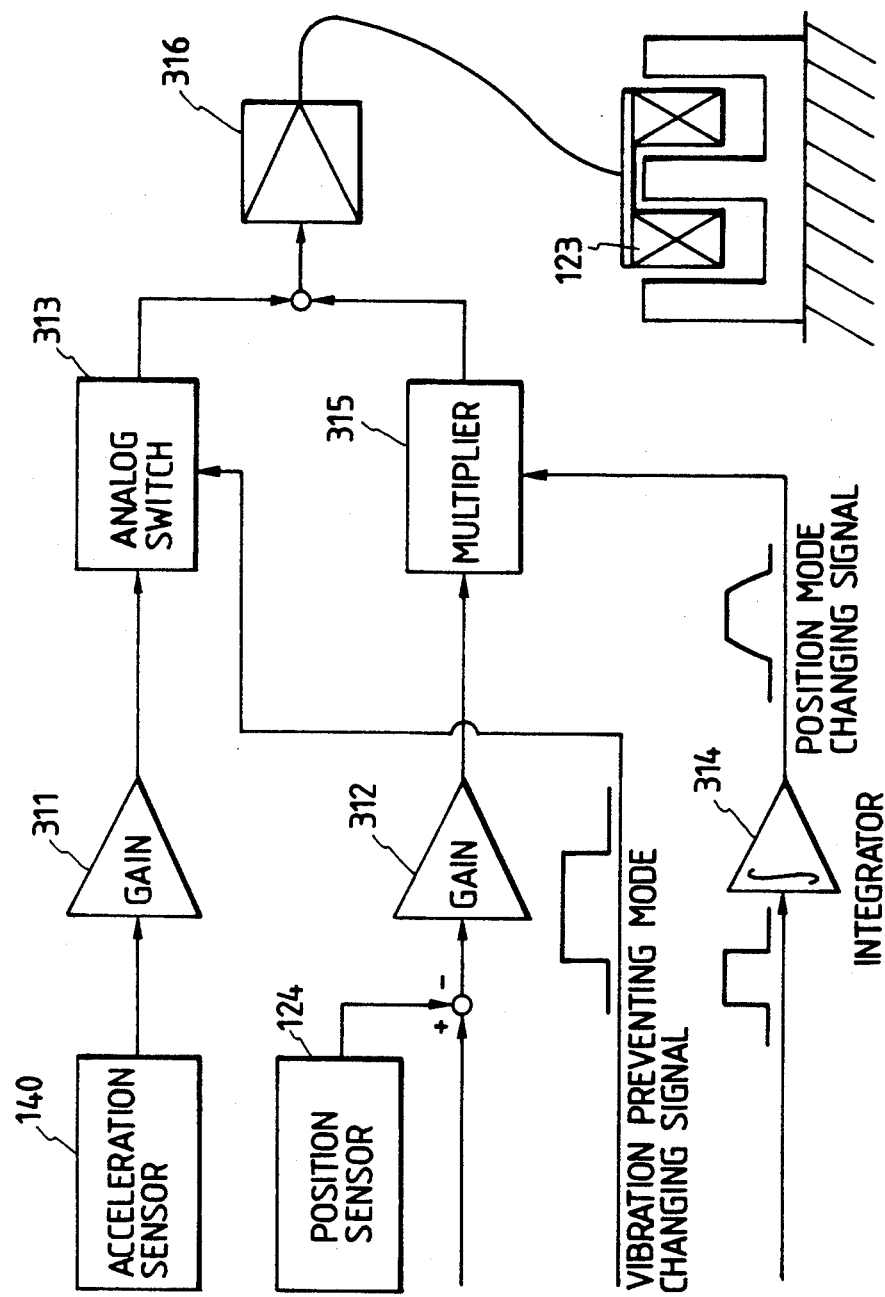
FIG. 37 is a block diagram of a control system enabling the changing mode system of control of the vibration prevention for eliminating the problems in FIG. 36.

FIG. 37 is a block diagram showing a circuit realizing the mode changing shown in FIG. 36. Outputs of the acceleration sensor 140 and the position sensor 124 are amplified by the proportional integral amplifier 311 and the PID amplifier 312, respectively. The signal from the acceleration sensor is turned on or off by an analog switch 313, and the output from the position sensor is multiplied with the output of an integrator 314 by a multiplier 315. These signals are converted into a driving current by a final amplifier 316 and drive the voice coil motor 123.

Figure 38:
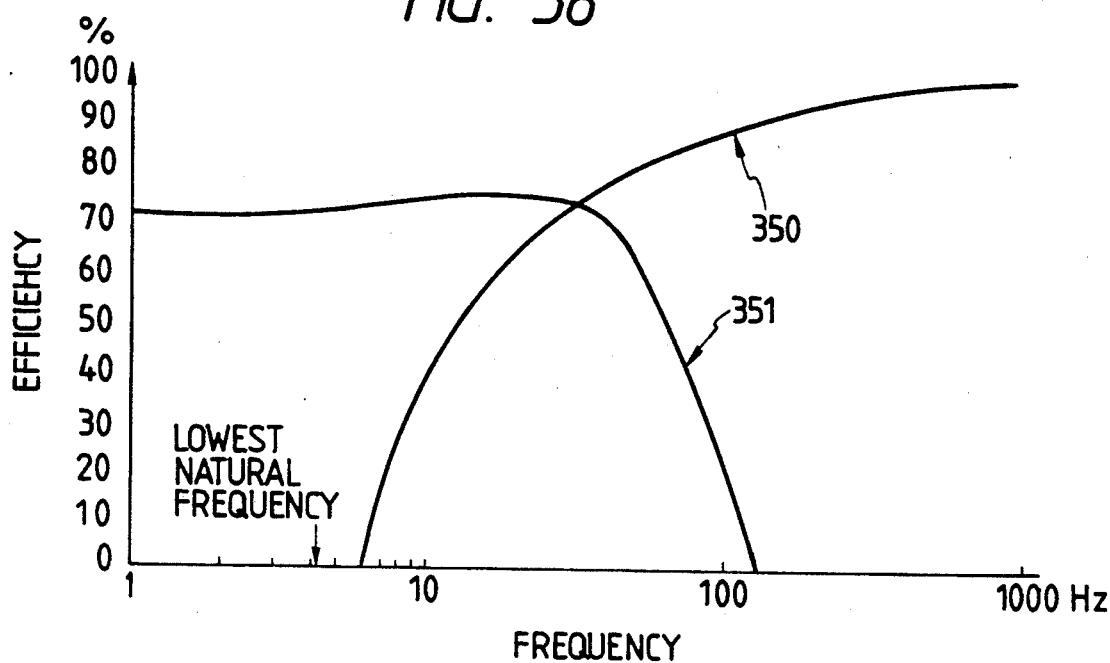
FIG. 38 is a distribution diagram of the vibration preventing efficiency showing the sharing of active vibration preventing by the above-mentioned control system and the passive vibration control by the mechanical system.

FIG. 38 is a distribution diagram of the vibration preventing efficiency showing sharing of the active vibration preventing by the above-mentioned control system and the passive vibration preventing by the mechanical system. The vibration preventing efficiency in this case is the complement of the transfer function. In general, the passive vibration preventing is not effective for a frequency lower than $\sqrt{2}$ of the natural frequency as shown in characteristic 350. Consequently, when the vibration preventing of the passive system is performed, the natural frequency of the vibration preventing base is made as low as possible. In this case, however, since the vibration preventing system is supported using a weak spring, the position accuracy cannot be easily specified and the reduction of the natural frequency is limited.

Figure 39:
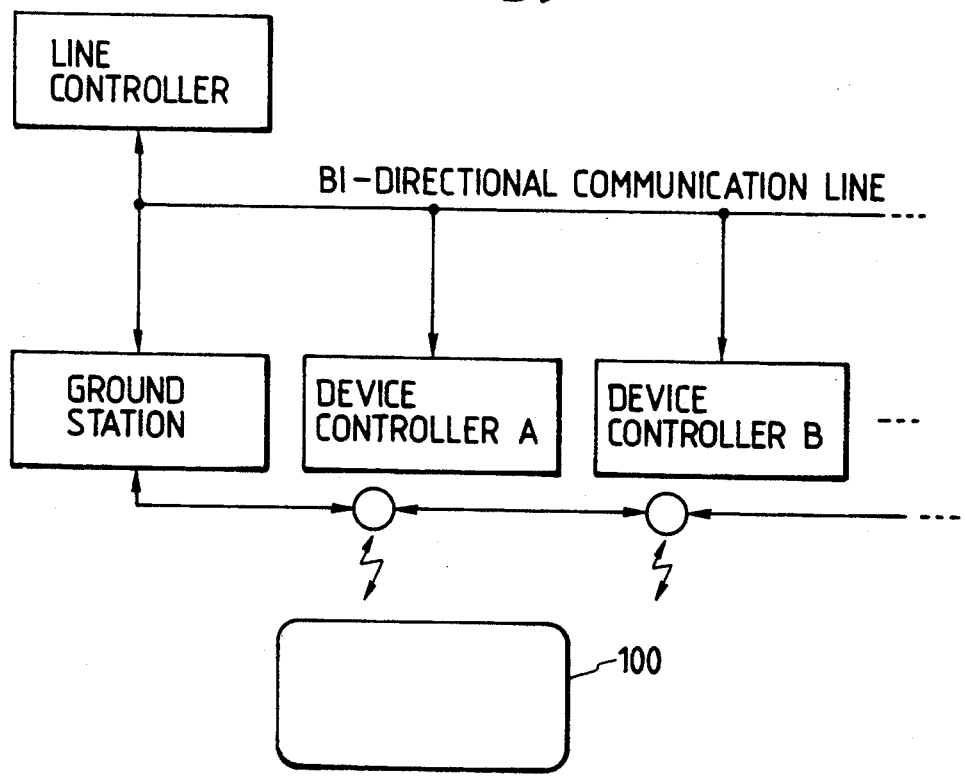
FIG. 39 is a block diagram of a semiconductor manufacturing process.

FIG. 39 shows an example of the semiconductor manufacturing process using the self propelled vehicle 100 with the vibration preventing base of the embodiment where information is transmitted or received by bidirectional communication through a line controller for the positioning of each device controller for the semiconductor manufacturing process and the mounting base having the function of position control of the vehicle and vibration preventing and for the control of the transfer mechanism installed on the vehicle.

Figure 40:
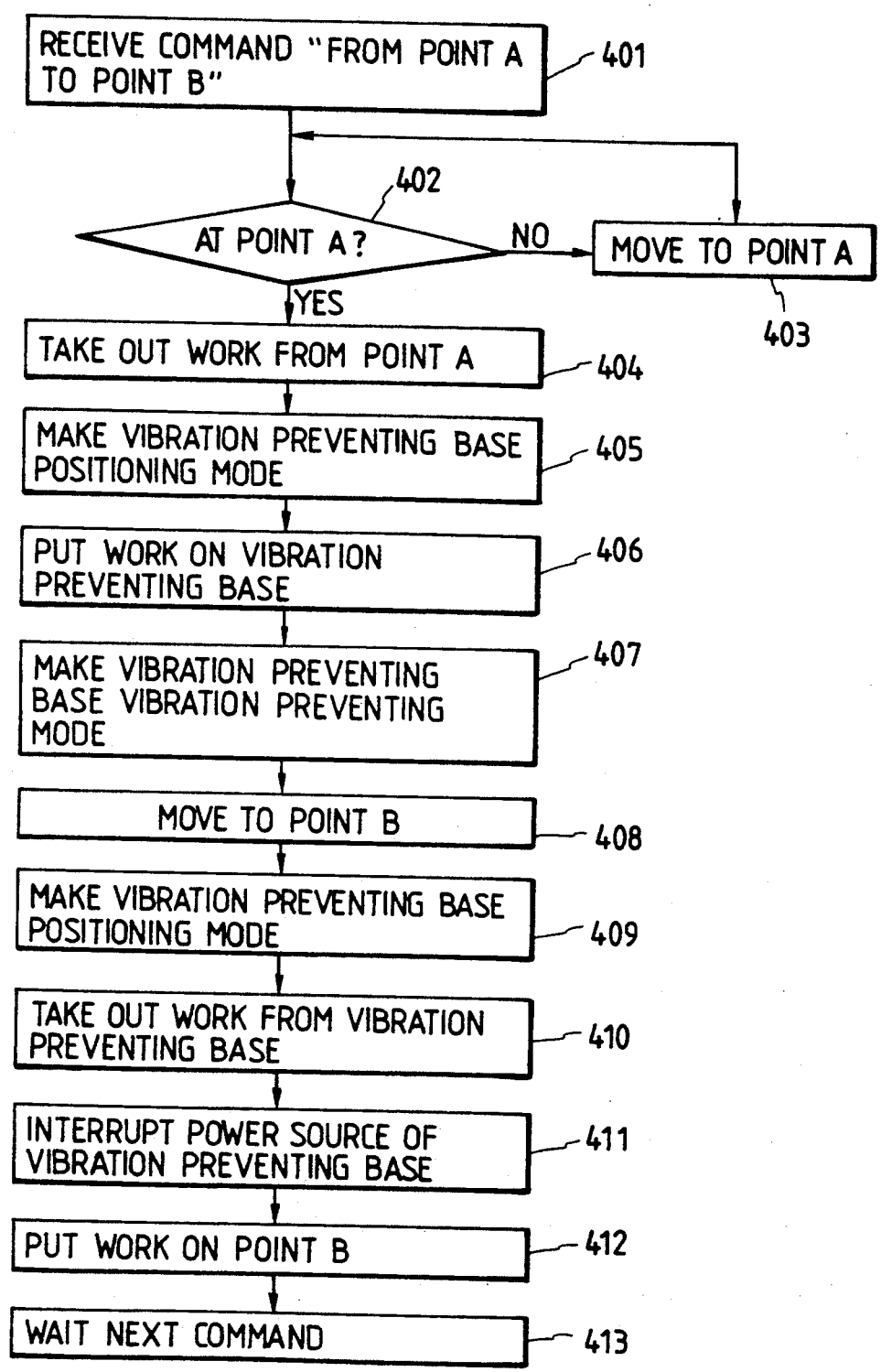
FIG. 40 is a flow chart showing control when the self-propelled vehicle is utilized in a semiconductor manufacturing process and carries semiconductor substance.

FIG. 40 is a flow chart showing control of the self propelled vehicle, the mounting base with vibration preventing function, and the transfer mechanism by the line controller. First a command of position "from point A to point B" is issued from the line controller to the vehicle (step 401). It is determined whether the vehicle is at point A or not based on the detection result of the position detector installed on the vehicle (step 402). If the vehicle is not at point A, the vehicle is moved to point A (step 403). When the vehicle is at point A, work is taken out by the transfer mechanism installed on the vehicle (step 404). If the work is taken out by the transfer mechanism, the vibration preventing base is placed in the positioning mode (step 405). The work is put on the vibration preventing base (step 406) and the vibration preventing base is placed in the vibration preventing mode (step 407). The vehicle is then moved to point B (step 408). If the vehicle is moved to point B, the vibration preventing base is placed in the positioning mode (step 409). If the positioning of the vibration preventing base is finished, the work is taken out of the vibration preventing base by the transfer mechanism (step 410). If the taking-out of the work is finished by the transfer mechanism, the power source of the vibration preventing base is interrupted (step 411). The work is placed at point B (step 412). If the operation series is finished, then the vehicle waits for the next command from the line controller (step 413).

Figure 41:
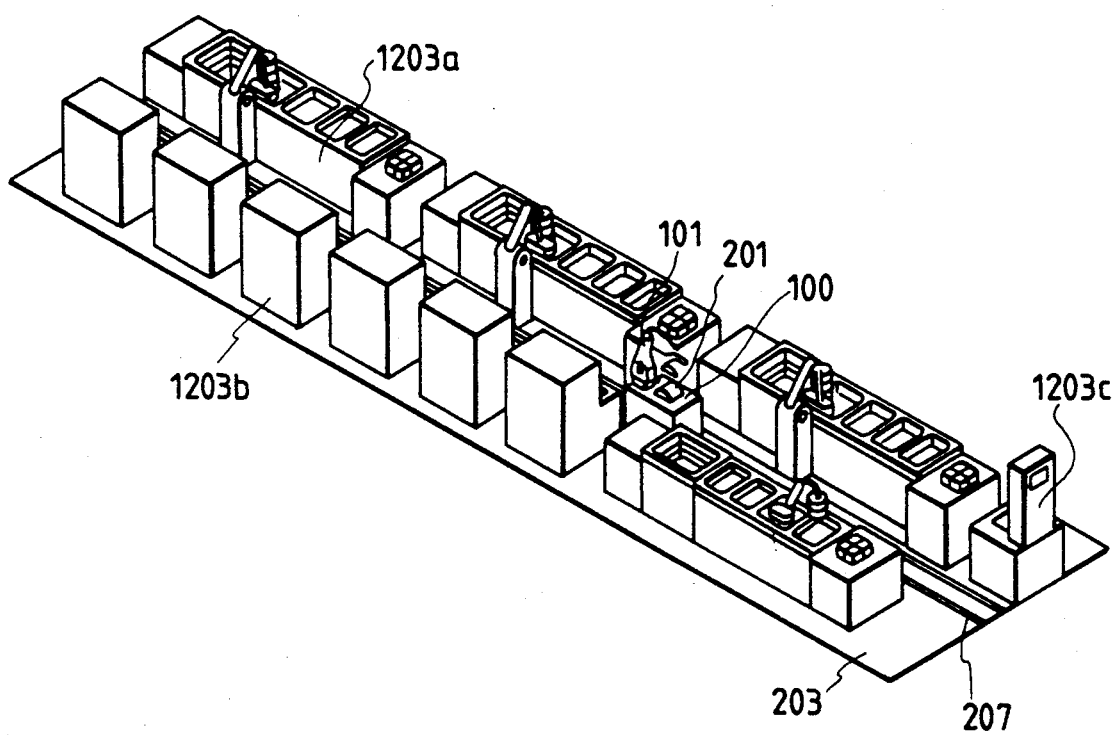
FIG. 41 is a perspective view showing the self-propelled vehicle with the vibration preventing base in a semiconductor manufacturing processing line.

FIG. 41 is a perspective view showing an example of a state wherein the vehicle with the vibration preventing base of the embodiment is used in a semiconductor manufacturing process. In the semiconductor manufacturing process, various types of semiconductor manufacturing devices, for example, a washing device 1203a, a resist device 1203b, a delivery device 1203c and the like are arranged on a periphery of the carrying path, and the self propelled vehicle travels between these devices. In this case, a traveling surface formed of the rails 207 is provided on a floor surface 203, but as described in above, the existence of a seam level difference 208 of the rails is inevitable, and in order to realize a down flow to maintain dustless environment in a dustless or clean room, the floor surface 203 is of net shape or of a drain board shape, and a space under the floor is hollow. Consequently, if the vibration preventing base 120 is not used, it is quite difficult that the surface accuracy of the traveling surface 207 to maintain the vibration during the carrying to 0.1 G (about 1 m/s²) or less is realized. Also since many types of the semiconductor manufacturing devices 1203a–1203c exist and the transfer positions of the wafer cassette differ in the present circumstances, the robot arm 101 is used for the transfer and in order to perform the secure transfer of a substance without vibration, the positioning of the wafer cassette is important.

In the present invention, the combination of the passive vibration preventing mechanism and the active vibration preventing mechanism may be changed depending on the property of the substance 201 to be carried. For example, when a liquid substance is carried, since the vibration in the horizontal plane becomes more important than the vibration in the vertical direction, it is preferable that the vibration in the horizontal plane is prevented by the active vibration preventing mechanism. Further, if there is margin in the energy consumption and the total weight allowable for the vibration preventing mechanism, of course, it is preferable that the active vibration preventing mechanism is used in each axis.

According to the present invention, when a substance requiring avoidance of vibration, such as wafer in a semiconductor manufacturing process is carried by the self propelled vehicle, since it can be effected that the vibration of the vehicle is not applied or transmitted to the substance, effects exist in that the substance can be carried without generating damage thereto. Also since the position relation between the mounting base for mounting the substance and the vehicle body can be determined to a prescribed reference position, the substance can be loaded or unloaded securely by a transfer mechanism. Further since the control of the positioning device is gradually raised, the positioning of the mounting base is performed without rapid change of the position and the moving speed at the present state, and effects exist in that during the positioning operation, the vibration (due to rapid moving of the mounting base to the reference position is not produced, and the positioning time can be reduced.

According to the above-described embodiments, an unmanned self-propelled vehicle favorable for use in a narrow place and capable of traveling in all directions can be obtained. Also, a traveling mechanism can be obtained where generation of dust due to setting of a steering wheel or the like can be prevented and a suspension system prevents the body from rolling and pitching caused by a partial load. These features are important particularly for carrying goods within a clean room for semiconductor manufacturing.

While we have shown and described several embodiments in accordance with the present invention, it is understood that the same is not limited thereto but is susceptible of numerous changes and modifications as known to those skilled in the art and we therefore do not wish to be limited to the details shown and described herein but intend to cover all such changes and modifications as are encompassed by the scope of the appended claims.

We claim:

1. A self-propelled vehicle comprising:
at least three wheels for driving the vehicle, each wheel including at least one shaft extending in a tangential direction of an outer circumferential surface of the wheel, and roller means rotatable mounted for rotation about the at least one shaft so that the wheel is movable at least in a rotational direction of the wheel and a rotational direction of the roller means;
means for mounting the at least three wheels with respect to a chassis of the vehicle in directions so that the rotary axes of the wheels are in a nonparallel relationship, the chassis having a major rectangular shape with a pair of sides and a minor sides, the major axis being longer than the minor sides, one of the wheels being mounted at the center point of one of the major sides and the two remaining wheels being mounted at opposite ends of the other one of the major sides, and
motor means for driving respective ones of the at least three wheels, and control means for controlling the motor means, the control means including means for detecting a lateral deviation of the vehicle with respect to the travelling direction of the vehicle and an angular deviation of the travelling direction with respect to a guidance target, means for evaluating a predetermined determinant in accordance with the travelling direction of the vehicle together with a desired travelling speed, means for estimating circumferential speeds of the at least three wheels in accordance with the results of evaluating the determinant, and rotational speed means for controlling the rotational speed of the motor means for the at least three wheels in accordance therewith.

2. A vehicle according to claim 1, wherein the control means for the motor means includes amplifier means.

3. A vehicle according to claim 1, wherein the angle formed between the travelling direction of the vehicle and the vehicle is maintained constant, and the predetermined determinant is evaluated with respect to the lateral deviation of the vehicle with respect to the travelling direction.

4. A self-propelled vehicle comprising:
a rectangular chassis having a pair of major sides and a pair of minor sides, the major sides being longer than the minor sides;
three wheels for supporting the chassis on a travelling surface for the vehicle, the three wheels being mounted so that the rotary axes of the wheels are in a nonparallel relationship and arranged so that a rotational plane of one wheel is directed in a direction extending substantially in parallel to the main travelling direction of the vehicle along a guide target formed on the travelling surface, and rotational planes of the remaining two wheels being directed at symmetrical opposite angles with respect to the main travelling direction of the vehicle, one of the wheels being mounted at the center point of one of the major sides and the two remaining wheels being mounted at opposite ends of the other one of the major sides each of the wheels being connected to a respective motor mounted on the chassis for driving a respective wheel, each of the wheels including a plurality of roller lines arranged alternately in a zig-zag form about the outer circumferential surface of the wheel so that rollers of one roller line are overlapped in relation to rollers of another roller line, each of the rollers of a respective roller line being rotatably mounted for rotation about a shaft arranged so as to extend in a tangential direction of an outer circumferential surface of the wheel, and each of the rollers having a barrel shape so that a circumferential surface of one of the rollers of the wheels is always in contact with the travelling surface;

power means provided on the chassis for at least supplying power to the driving motors for the wheels; and controlling means for controlling each of the driving motors for driving the wheels in accordance with a longitudinal direction travelling speed, a lateral travelling speed and rotational angles speed obtained by a lateral deviation and an angular deviation of the vehicle measured by a sensor mounted on the vehicle for sensing the guide target.

5. A vehicle according to claim 4, wherein the rotational planes of the remaining two wheels are directed respectively in directions of +45° and −45° with respect to the main travelling direction of the vehicle.

6. A vehicle according to claim 4, wherein the at least three wheels are arranged on the chassis at an angle such that a line formed by a rotary axis of each wheel passes through a position proximate to and at least one of above and below a center of gravity of the vehicle.

7. A vehicle according to claim 4, wherein the controlling means for the motor means includes amplifier means.

8. A vehicle according to claim 4, further comprising means provided on the vehicle for mounting a substance to be carried by the vehicle, a robot mechanism mounted on the vehicle for handling the substance to be carried by the vehicle, and vibration preventing base means interposed between the vehicle and the substance mounting means for reducing vibration acceleration applied to the substance carried by the vehicle, the vibration preventing base means including vibration frequency means for controlling a vibration frequency of the vibration preventing base means so as to be lower than a vibration frequency of the vehicle.

9. A vehicle according to claim 8, wherein the vibration frequency means controls the vibration frequency of the vibration preventing base means to be lower than $1/\sqrt{2}$ of the vibration frequency of the vehicle.

10. A self-propelled vehicle according to claim 4, wherein each of the wheels is disposed within a boundary of the chassis.

* * * * *